United States Patent [19]
Nakaumura et al.

[11] Patent Number: 5,995,404
[45] Date of Patent: Nov. 30, 1999

[54] DRAM ARCHITECTURE WITH ALIGNED DATA STORAGE AND BOND PADS

[75] Inventors: Masayuki Nakaumura, Tokyo; Brent S. Haukness, Garland; Takesada Akiba, Tokyo, all of Japan

[73] Assignee: Texas Instruments Incorporated, Dallas, Tex.

[21] Appl. No.: 08/891,536

[22] Filed: Jul. 11, 1997

Related U.S. Application Data

[60] Provisional application No. 60/021,565, Jul. 11, 1996.

[51] Int. Cl.$^6$ ........................................... G11C 5/06
[52] U.S. Cl. .................. 365/63; 365/230.03; 365/230.05
[58] Field of Search ................................ 365/230.03, 63, 365/200, 230.09, 239, 186, 191, 185.05, 185.08, 51

[56] References Cited

U.S. PATENT DOCUMENTS

| | | | |
|---|---|---|---|
| 5,689,465 | 11/1997 | Sukegawa et al. | 365/200 |
| 5,691,949 | 11/1997 | Hively et al. | 365/230.03 |
| 5,712,827 | 1/1998 | Ogihara et al. | 365/230.03 |
| 5,724,281 | 3/1998 | Nagaba | 365/63 |
| 5,802,005 | 9/1998 | Nakamura et al. | 365/230.03 |

*Primary Examiner*—David Nelms
*Assistant Examiner*—Tong Le
*Attorney, Agent, or Firm*—Lawrence J. Bassuk; Richard L. Donaldson

[57] ABSTRACT

A DRAM memory device has bond pads, such as DQa through DQh, arranged along the length of the substrate in a certain order. The bond pads carry data signals to and from the device with each bond pad carrying the same data bit of every data word. Arrays of memory cells 1201, 1210 extend transverse of the bond pads and are arranged in pairs of columns 1212–1226. Data circuits 1242, 1244 transmit the data signals between the bond pads and arrays. The data circuits include data lines 1230–1236 extending between the bond pads and pairs of columns of arrays. Each data line extends from one bond pad to plural pairs of columns of arrays in a sequence the same certain order.

5 Claims, 14 Drawing Sheets

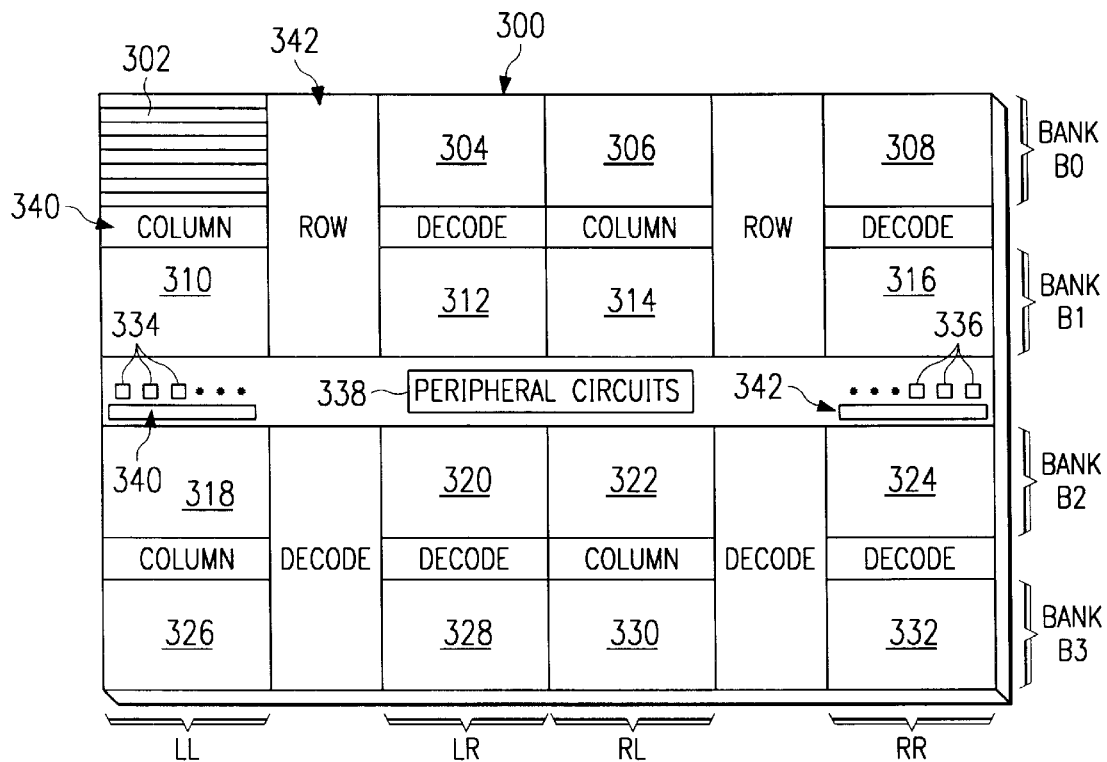
FIG. 3
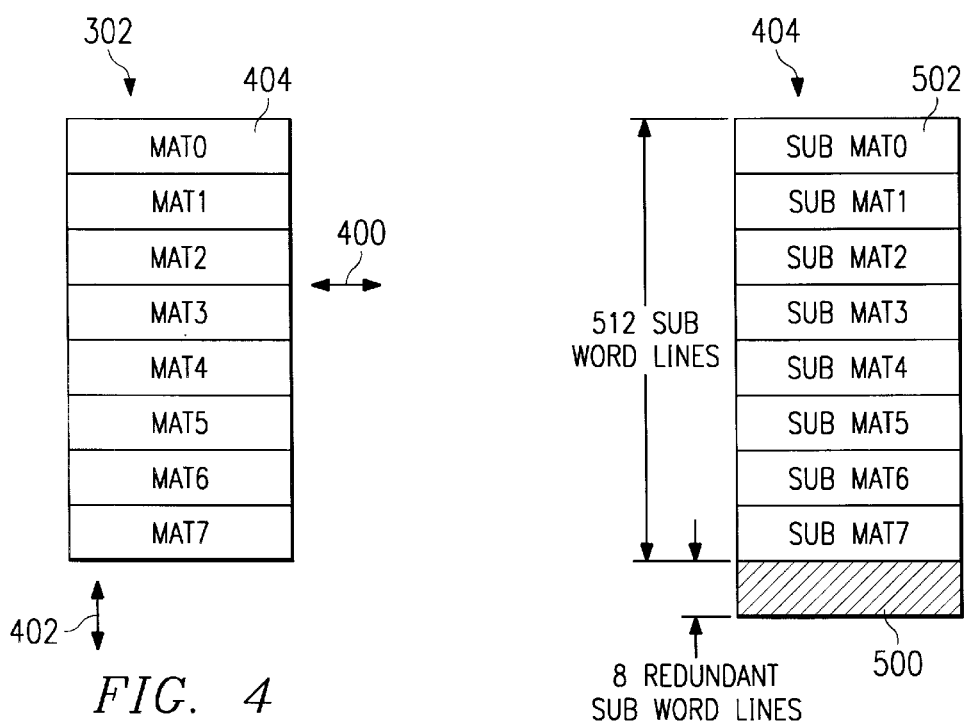
FIG. 4
FIG. 5

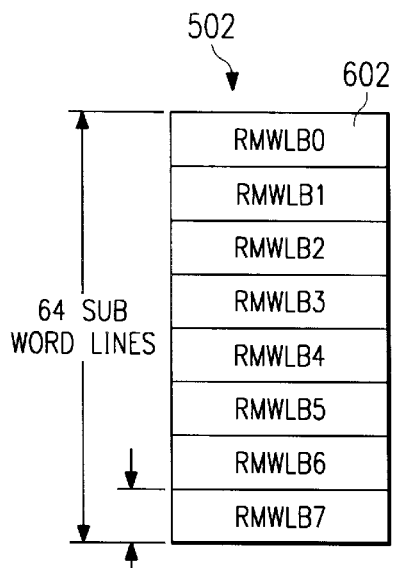

FIG. 6

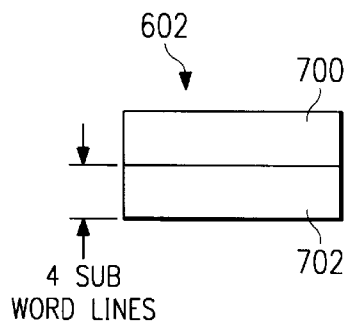

FIG. 7

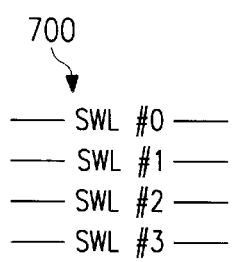

FIG. 8

| | 100 | | |
|---|---|---|---|
| 104 | | 104 | |
| VDD ☐ | 1 | 88 | ☐ VSS |
| DQ0 ☐ | 2 | 87 | ☐ DQ15 |
| VDDQ ☐ | 3 | 86 | ☐ VSSQ |
| DQ1 ☐ | 4 | 85 | ☐ DQ14 |
| DQ2 ☐ | 5 | 84 | ☐ DQ13 |
| VSSQ ☐ | 6 | 83 | ☐ VDDQ |
| DQ3 ☐ | 7 | 82 | ☐ DQ12 |
| DQ4 ☐ | 8 | 81 | ☐ DQ11 |
| VDDQ ☐ | 9 | 80 | ☐ VSSQ |
| DQ5 ☐ | 10 | 79 | ☐ DQ10 |
| DQ6 ☐ | 11 | 78 | ☐ ADQ9 |
| VSSQ ☐ | 12 | 77 | ☐ VDDQ |
| DQ7 ☐ | 13 | 76 | ☐ DQ8 |
| DQM0 ☐ | 14 | 75 | ☐ DQM1 |
| VDD ☐ | 15 | 74 | ☐ VSS |
| NC ☐ | 16 | 73 | ☐ NC |
| W̄ ☐ | 17 | 72 | ☐ NC |
| C̄ĀS̄ ☐ | 18 | 71 | ☐ Vref |
| R̄ĀS̄ ☐ | 19 | 70 | ☐ NC(/CLK) |
| C̄S̄ ☐ | 20 | 69 | ☐ CLK |
| BA1 ☐ | 21 | 68 | ☐ CKE |
| A10/AP ☐ | 22 | 67 | ☐ BA0 |
| VDD ☐ | 23 | 102 | 66 | ☐ VSS |
| A0 ☐ | 24 | 65 | ☐ A12,NC |
| A1 ☐ | 25 | 64 | ☐ A11 |
| A2 ☐ | 26 | 63 | ☐ A9 |
| A3 ☐ | 27 | 62 | ☐ A8 |
| A4 ☐ | 28 | 61 | ☐ A7 |
| A5 ☐ | 29 | 60 | ☐ A6 |
| VDD ☐ | 30 | 59 | ☐ VSS |
| DQM2 ☐ | 31 | 58 | ☐ DQM3 |
| DQ16 ☐ | 32 | 57 | ☐ DQ31 |
| VSSQ ☐ | 33 | 56 | ☐ VDDQ |
| DQ17 ☐ | 34 | 55 | ☐ DQ30 |
| DQ18 ☐ | 35 | 54 | ☐ DQ29 |
| VDDQ ☐ | 36 | 53 | ☐ VSSQ |
| DQ19 ☐ | 37 | 52 | ☐ DQ28 |
| DQ20 ☐ | 38 | 51 | ☐ DQ27 |
| VSSQ ☐ | 39 | 50 | ☐ VDDQ |
| DQ21 ☐ | 40 | 49 | ☐ DQ26 |
| DQ22 ☐ | 41 | 48 | ☐ DQ25 |
| VDDQ ☐ | 42 | 47 | ☐ VSSQ |
| DQ23 ☐ | 43 | 46 | ☐ DQ24 |
| VDD ☐ | 44 | 45 | ☐ VSS |

FIG. 9 (PRIOR ART)

2-BIT BURST SEQUENCES

| | INTERNAL COLUMN ADDRESS A0 | | | |
|---|---|---|---|---|
| | DECIMAL | | BINARY | |
| | START | 2ND | START | 2ND |
| SERIAL | 0 | 1 | 0 | 1 |
| | 1 | 0 | 1 | 0 |
| INTERLEAVE | 0 | 1 | 0 | 1 |
| | 1 | 0 | 1 | 0 |

FIG. 19
1900

4-BIT BURST SEQUENCES

| | INTERNAL COLUMN ADDRESS A1 A0 | | | | | | | |
|---|---|---|---|---|---|---|---|---|
| | DECIMAL | | | | BINARY | | | |
| | START | 2ND | 3RD | 4TH | START | 2ND | 3RD | 4TH |
| SERIAL | 0 | 1 | 2 | 3 | 00 | 01 | 10 | 11 |
| | 1 | 2 | 3 | 0 | 01 | 10 | 11 | 00 |
| | 2 | 3 | 0 | 1 | 10 | 11 | 00 | 01 |
| | 3 | 0 | 1 | 2 | 11 | 00 | 01 | 10 |
| INTERLEAVE | 0 | 1 | 2 | 3 | 00 | 01 | 10 | 11 |
| | 1 | 0 | 3 | 2 | 01 | 00 | 11 | 10 |
| | 2 | 3 | 0 | 1 | 10 | 11 | 00 | 01 |
| | 3 | 2 | 1 | 0 | 11 | 10 | 01 | 00 |

FIG. 20
2000

8-BIT BURST SEQUENCES

| | INTERNAL COLUMN ADDRESS A2 A1 A0 | | | | | | | | | | | | | | | |
|---|---|---|---|---|---|---|---|---|---|---|---|---|---|---|---|---|
| | DECIMAL | | | | | | | | BINARY | | | | | | | |
| | START | 2ND | 3RD | 4TH | 5TH | 6TH | 7TH | 8TH | START | 2ND | 3RD | 4TH | 5TH | 6TH | 7TH | 8TH |
| SERIAL | 0 | 1 | 2 | 3 | 4 | 5 | 6 | 7 | 000 | 001 | 010 | 011 | 100 | 101 | 110 | 111 |
| | 1 | 2 | 3 | 4 | 5 | 6 | 7 | 0 | 001 | 010 | 011 | 100 | 101 | 110 | 111 | 000 |
| | 2 | 3 | 4 | 5 | 6 | 7 | 0 | 1 | 010 | 011 | 100 | 101 | 110 | 111 | 000 | 001 |
| | 3 | 4 | 5 | 6 | 7 | 0 | 1 | 2 | 011 | 100 | 101 | 110 | 111 | 000 | 001 | 010 |
| | 4 | 5 | 6 | 7 | 0 | 1 | 2 | 3 | 100 | 101 | 110 | 111 | 000 | 001 | 010 | 011 |
| | 5 | 6 | 7 | 0 | 1 | 2 | 3 | 4 | 101 | 110 | 111 | 000 | 001 | 010 | 011 | 100 |
| | 6 | 7 | 0 | 1 | 2 | 3 | 4 | 5 | 110 | 111 | 000 | 001 | 010 | 011 | 100 | 101 |
| | 7 | 0 | 1 | 2 | 3 | 4 | 5 | 6 | 111 | 000 | 001 | 010 | 011 | 100 | 101 | 110 |
| INTERLEAVE | 0 | 1 | 2 | 3 | 4 | 5 | 6 | 7 | 000 | 001 | 010 | 011 | 100 | 101 | 110 | 111 |
| | 1 | 0 | 3 | 2 | 5 | 4 | 7 | 6 | 001 | 000 | 011 | 010 | 101 | 100 | 111 | 110 |
| | 2 | 3 | 0 | 1 | 6 | 7 | 4 | 5 | 010 | 011 | 000 | 001 | 110 | 111 | 100 | 101 |
| | 3 | 2 | 1 | 0 | 7 | 6 | 5 | 4 | 011 | 010 | 001 | 000 | 111 | 110 | 101 | 100 |
| | 4 | 5 | 6 | 7 | 0 | 1 | 2 | 3 | 100 | 101 | 110 | 111 | 000 | 001 | 010 | 011 |
| | 5 | 4 | 7 | 6 | 1 | 0 | 3 | 2 | 101 | 100 | 111 | 110 | 001 | 000 | 011 | 010 |
| | 6 | 7 | 4 | 5 | 2 | 3 | 0 | 1 | 110 | 111 | 100 | 101 | 010 | 011 | 000 | 001 |
| | 7 | 6 | 5 | 4 | 3 | 2 | 1 | 0 | 111 | 110 | 101 | 100 | 011 | 010 | 001 | 000 |

2100
FIG. 21

DRAM ARCHITECTURE WITH ALIGNED DATA STORAGE AND BOND PADS

CROSS-REFERENCE TO RELATED APPLICATIONS

This application relates to the disclosures in U.S. patent application Ser. Nos. 08/717,548, filed Sep. 23, 1996, now U.S. Pat. No. 5,802,005 and 08/891,596, filed Jul. 11, 1997. This application claims the benefit of the filing date of provisional application serial number 60/021,565, filed Jul. 11, 1996.

BACKGROUND OF THE INVENTION

1. Field of the Invention

This invention relates generally to semiconductor integrated circuit memory devices and particularly relates to such synchronous dynamic random access memory devices (SDRAMs) sending and receiving bursts of data synchronous with a clock signal.

2. Description of the Related Art

DRAMs are used in desktop and other computers and other electronic machines needing memory devices. Common reasons for using DRAMs include their providing the greatest density of memory cells on a semiconductor chip, relative low cost per bit of stored data and relatively high speed for their cost. With advances in technology, each generation of DRAM memory devices has increased the number of memory cells on a chip by a factor of four. With more recent microprocessors operating at 100 Megahertz and above, faster DRAMs are needed to supply data and instructions to the microprocessor.

With this need for larger storage capacity and greater speed, DRAMs have evolved that synchronize the transfer of data, addresses and control signals with a clock signal. These requirements for larger storage capacity and greater speed also raise new difficulties in designing the circuits constituting and the processes for manufacturing a DRAM memory device.

In prior DRAM memory devices, the bond pads on the semiconductor substrate occurred at one location with storage of the data signals occurring at other spaced locations on the substrate. Relatively long data lines occurred on the substrates to convey the data between the bond pads and storage locations. This led to large parasitic capacitances in the data lines that required larger drive circuits. The parasitic capacitances and resulting high power required to drive the devices prevented an economical device from operating at 100 megahertz or faster.

Data also must be written into and read from the synchronous DRAM devices in one of two different modes: serial and interleaved. In serial mode, the data occurs in the same sequence as its serial addresses. In interleaved mode, the data occurs in a certain, well-defined sequence other than sequential. Implementing a synchronous DRAM device can be accomplished in either a pipelined or pre-fetch architecture; in either case, provisions must be made to achieve operation in both the serial and interleaved data modes.

SUMMARY OF THE INVENTION

In accordance with the invention, a memory device is arranged to store the data bits received at each bond pad in arrays proximate that bond pad and extending generally transverse to the line of bond pads. To provide a four bit pre-fetch arrangement, data lines connected to each bond pad extend to four adjacent pairs of columns of arrays. Each pair of columns of arrays connect to four data lines. This reduces the parasitic capacitances of the data lines and provides for higher speed and lower power operation of the device.

In particular, the disclosed memory device comprises a semiconductor substrate carrying plural bond pads. The bond pads extend linearly along the substrate in a first direction. The bond pads carry data signals to and from the device with the data signals being arranged in words of plural bits. Each bond pad thus carrys one data bit of each word. The bond pads are arranged in a certain order on the substrate.

Arrays of memory cells are formed on and extend across the substrate. The arrays of memory cells store the data signals carried to and from the device by the bond pads. The arrays of memory cells are arranged in four banks that extend in the first direction in parallel with the bond pads. In each bank the arrays of memory cells are arranged in columns that extend transverse to the first direction. The columns are paired with one another.

Data circuits transmit the data signals between the bond pads and array. The data circuits include data lines extending between the bond pads and pairs of columns of arrays. Each data line extends from one bond pad to plural pairs of columns of arrays in a sequence the same as the certain order.

The bond pads are arranged in a line along the central axis of the substrate. Each data line extends from one bond pad to four pairs of columns of arrays. Plural data lines extend to each pair of columns of arrays in a particular arrangement the same as the certain order.

Four data lines extend to each pair of columns of arrays in the particular arrangement.

BRIEF DESCRIPTION OF THE DRAWING

FIG. 3 is an idealized plan view of the semiconductor integrated circuit or chip of the invention;

FIG. 4 is an idealized block diagram of an array of memory cells of FIG. 3;

FIG. 5 is an idealized block diagram of one MAT of memory cells of FIG. 4;

FIG. 6 is an idealized block diagram of one Sub MAT of memory cells of FIG. 5;

FIG. 7 is an idealized block diagram of one sub sub mat of memory cells of FIG. 6;

FIG. 8 is an idealized line diagram of four sub word lines of FIG. 7;

FIG. 9 is a diagram indicating pin numbers and acronyms for signals connected to each pin of the memory device of FIG. 1;

FIG. 19 is a chart indicating standard data sequences for a 2-bit burst of data;

FIG. 20 is a chart indicating standard data sequences for a 4-bit burst of data;

FIG. 21 is a chart indicating standard data sequences for an 8-bit burst of data;

DETAILED DESCRIPTION

Figure 1:
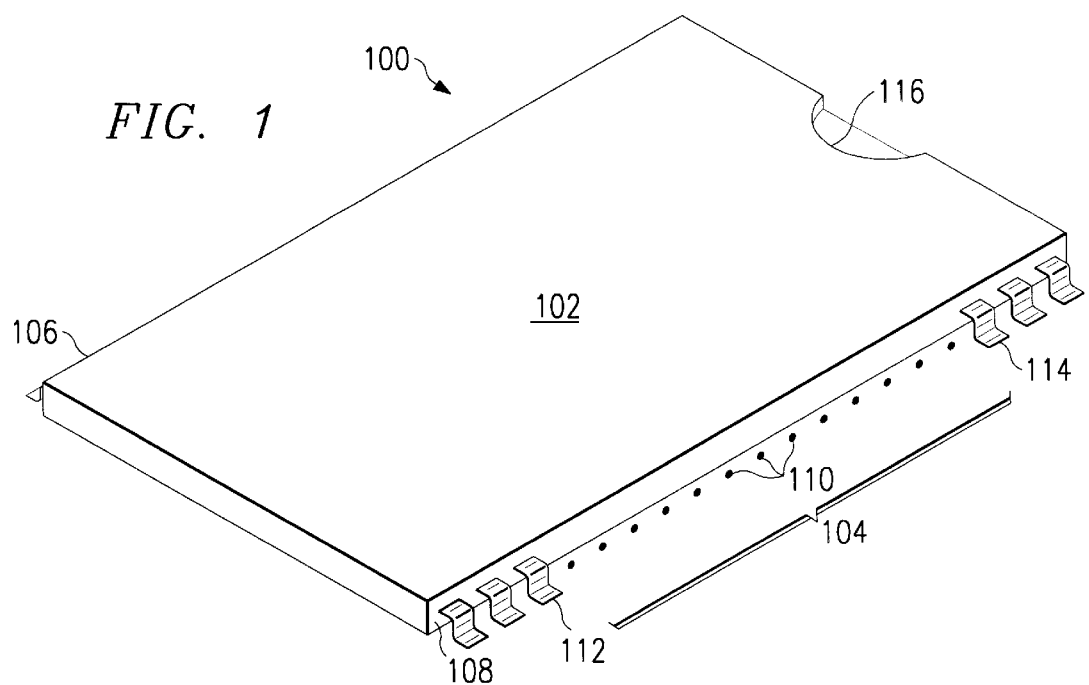
FIG. 1 is a perspective view of a memory device comprising a packaged semiconductor integrated circuit of the invention.

In FIG. 1, memory device 100 comprises a semiconductor integrated circuit encapsulated in a package 102. Metal conductive leads 104 extend from edges 106 and 108 of package 102. These leads 104 conduct electrical signals and electrical power to and from the contained semiconductor integrated circuit or chip. Dots 110 indicate additional plural leads existing along the edge 108 of package 102 between individual leads 112 and 114. The number of leads and their placements will be determined by organization and arrangement of data on the chip and by industry standards. The material for the package 102 encapsulating the chip will be some resinous material as desired. Depression 116 can be used to identify a top end of the memory device for orientation.

Figure 2:
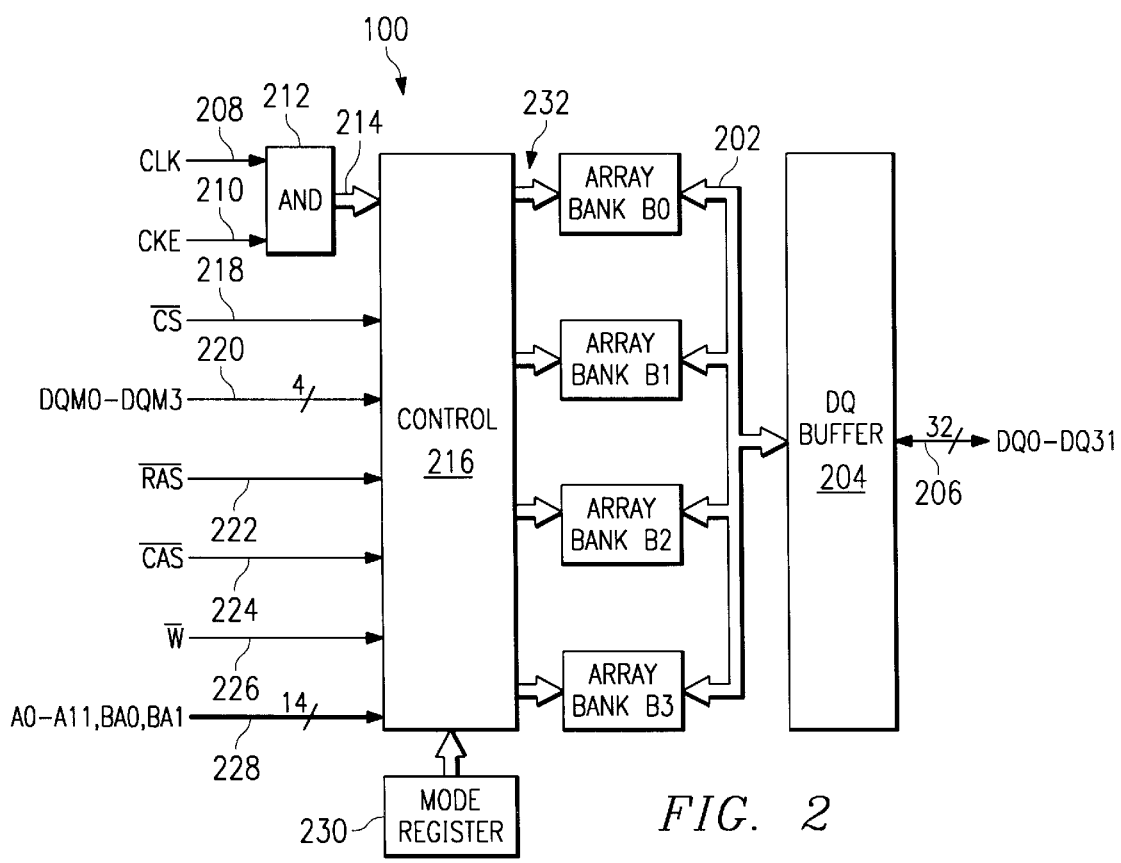
FIG. 2 is a functional block diagram of the memory device of FIG. 1.

In FIG. 2, memory device 100 provides four Array Banks B0, B1, B2 and B3 of memory cells for storing data signals. The data signals are transferred between the banks and thirty-two data leads DQ0–DQ31 on internal leads represented by leads 202, a DQ Buffer 204 and thirty-two individual lead lines 206. In this arrangement, thirty-two data signals are carried on leads 206 in parallel at one time.

The data signals stored in the four banks are accessed by two clock signals, several control signals and time multiplexed row and column address signals. The clock signal CLK on lead 208 and a clock enable signal CKE on lead 210 pass through AND block 212 and across leads 214 to Control block 216. An active low chip select signal CS_ on lead 218 connects to control block 216. DQM0–DQM3 output enable byte signals on four leads 220 also connect to Control block 216. The signals RAS_, CAS_ and W_ appear respectively on leads 222, 224 and 226 connecting to Control block 216. Fourteen address signals A0–A11, BA0 and BA1 appear on leads 228 also connecting to Control block 216. A Mode Register 230 also connects with Control block 216. Control block 216 accesses the data signals in Array Banks B0, B1, B2 and B3 through leads 232.

Memory device 100 thus is a synchronous dynamic random access memory organized as four banks of 2,097,152 words with thirty-two bits of data per word. The total capacity of memory device 100 is 268,435,456 data bits, commonly known as a 256 megabit SDRAM device, compatible with JEDEC standards for synchronous DRAMs.

In FIG. 3, semiconductor integrated circuit 300 contained within package 102 of memory device 100 comprises 16 arrays 302–332 of memory cells arranged in a 4×4 array. Banks B0, B1, B2 and B3 extend the length of semiconductor integrated circuit 300. Bank 0 thus consists of arrays 302, 304, 306 and 308. Bank 1 consists of arrays 310, 312, 314 and 316. Bank 2 consists of arrays 318, 320, 322 and 324, and Bank 3 consists of arrays 326, 328, 330 and 332. The arrays extending the width of chip 300 are identified as quadrants with the designations LL, LR, RL and RR indicating a Left or Right location. Thus a single array 302 can be identified as quadrant LL, Bank B0.

The chip 300 also carries bond pads represented by boxes 334 and 336 extending along the central axis of the chip. The leads 104 connect to these bond pads through bonding wires for carrying electrical signals to and from the chip and supplying electrical power to the chip. While only three bond pads have been shown at either end of the chip 300, additional bond pads occur on the chip to carry the required signals and provide additional test points. These additional bond pads are represented by the dots extending from the bond pads 334, 336.

Peripheral circuits 338 occur in the central area extending along the central axis of the chip 300 as desired. Between the arrays of memory cells 302–332, column decode circuits such as column decode circuits 340 extend along the length of the chip between banks B0 and B1 and between banks B2 and B3. Extending across the width of the chip, row decoder circuits 342 extend between quadrants LL and LR and between quadrants RL and RR.

The peripheral circuits can also occur at any desired location on chip 300. For example, data circuits 340 and 342, which electrically couple the data signals between the bond pads and the arrays of memory cells, physically exist between the bond pads and the arrays of memory cells.

Bank addresses BA0 and BA1 are used to select one of the four Banks B0, B1, B2, and B3. These two bank address signals are applied to the SDRAM with both the row and column address signals.

In FIG. 4, array 302 comprises eight mats or matrices MAT0–MAT7 of memory cells. Each of arrays 302–332 are arranged in a like manner so that describing one array 302 provides description of all arrays 302–332. Array 302 has the mats MAT0–MAT7 arranged in the same direction as indicated in FIG. 3. The row or word lines extend in the direction indicated by arrow 400 and has the column or bitlines arranged in the direction indicated by arrow 402. All of mats MAT0–MAT7 are arranged in the same way so that a description of MAT0 404 is a description of all of the other arrays in array 302 and the other arrays on the chip 300.

Row addresses A11, A10 and A9 are decoded to produce row factor signals selecting the mats of FIG. 4.

In FIG. 5, MAT0 404 comprises 8 sub arrays Sub MAT0–Sub MAT7 and an area 500 containing 8 redundant Sub word lines. The sub arrays Sub MAT0–MAT7 are arranged in a like orientation to MAT 404 with the word lines running along their length. MAT 404 contains 512 Sub word lines evenly divided among sub arrays Sub MAT0–MAT7 and an additional eight redundant Sub word lines in area 500. The redundant sub word lines can be distributed through the arrays, sub arrays and sub sub arrays as desired. Area 500 depicts the location for redundant word lines used in this embodiment. A description of Sub MAT0 502 is a description of all the other Sub MATs on chip 300.

Row address signals A8, A7 and A6 are used to produce row factor signals for selecting the sub mats of FIG. 5.

In FIG. 6, Sub MAT0 502 comprises eight sub sub arrays or row main word line blocks identified as RMWLB0–RMWLB7. Each of the sub sub arrays such as RMWLB0 602 contains eight sub word lines. Again a description of one of the sub sub arrays 602 is a description of all of the sub sub arrays on chip 300.

Row address signals A5, A4 and A3 are used to produce row factor signals for selecting the row main word line blocks or sub sub arrays of FIG. 6.

In FIG. 7, sub sub array 602 comprises two sub word line decoder select areas 700 and 702 with four sub word lines extending the length of each of the areas. Row address signal A2 is used to produce row factor signals for selecting the sub word line decoder select areas.

In FIG. 8, sub word line decoder select area 700 comprises four sub word lines number 0, number 1, number 2 and number 3. Row address signals A1 and A0 are used to produce row factor signals for selecting between the four sub word lines.

The diagrams of FIGS. 4 through 8 thus depict the particular arrangement of this embodiment of row or word lines on the substrate 300.

In FIG. 9, an idealized representation of memory device 100 depicts the package 102 with all of the leads 104 numbered and identified by their acronym name according to the JEDEC standard. For example, lead or pin 1 connects to VDD while lead or pin 88 connects to VSS. The following Table 1 provides the common names of these signals for their acronyms.

TABLE 1

| Acronyms | Common Names |
|---|---|
| A0–A11 | Address Inputs |
| A0–A11 | Row Addresses |
| A0–A8 | Column Addresses |
| A10/AP | Automatic Precharge Select |
| BA0, BA1 | Bank Select |
| CAS_ | Column Address Strobe |
| CKE | Clock Enable |
| CLK | System Clock |
| CS_ | Chip Select |
| DQ0–DQ31 | SDRAM Data Inputs/Outputs |
| DQM0–DQM3 | Data/Output Enable byte 0–3 |
| NC | No External Connect |
| RAS_ | Row Address Strobe |
| VDD | Power Supply (3.3 V typ.) |
| VDDQ | Power Supply Output Drivers (3.3 V typ.) |
| VREF | HSTL/SSTL Reference Voltage |
| VSS | Ground |
| VSSQ | Ground for Output Drivers |
| W_ | Write Enable |

Figure 10:
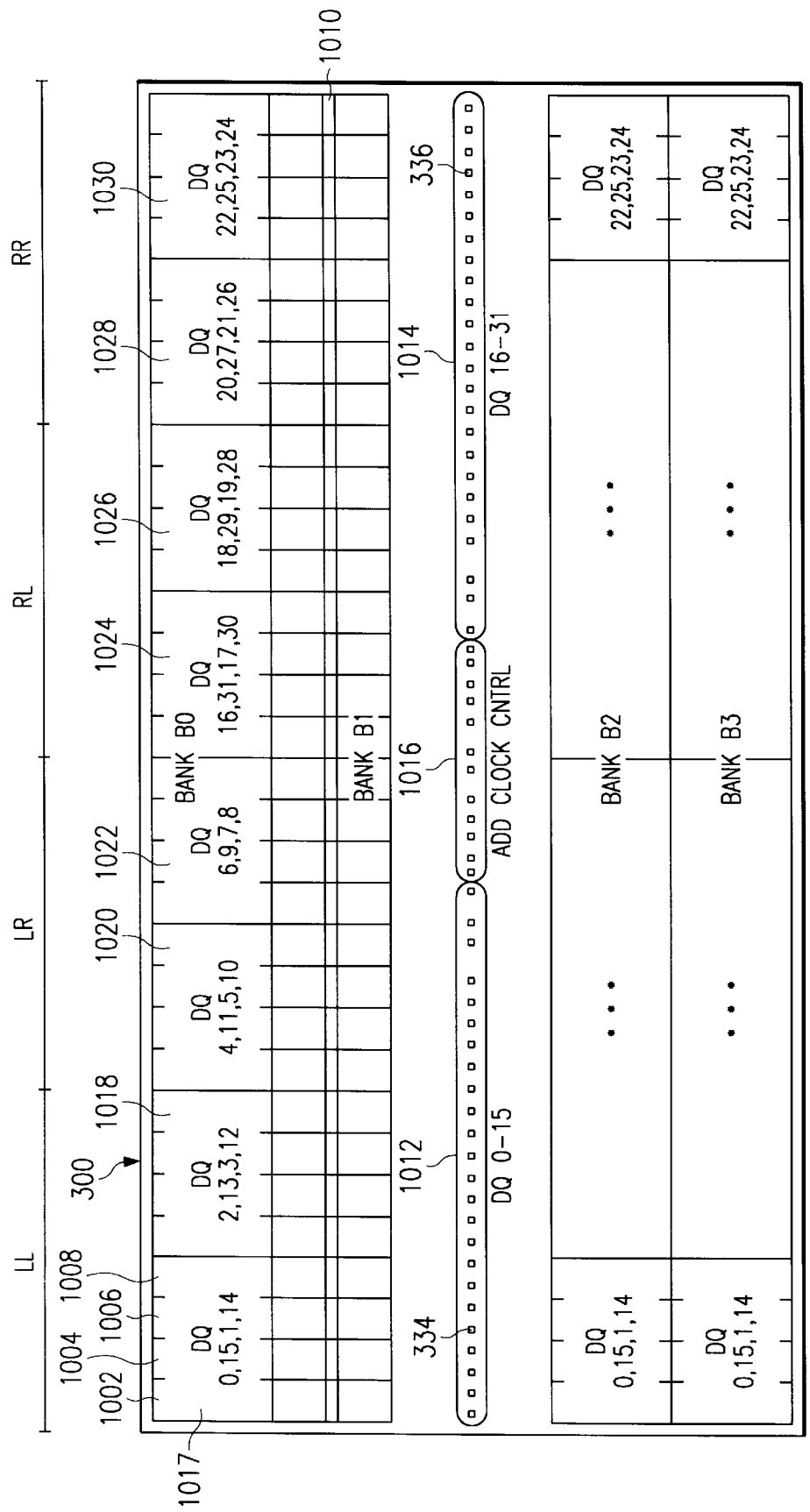
FIG. 10 is a block diagram indicating four banks of memory cells, assignment of data bits to groups of memory cells in the banks and relative locations of bond pads on the chip.

In FIG. 10, chip 300 has the Banks B0, B1, B2 and B3 divided along their respective column or bit line divisions, such as sections 1002, 1004, 1006 and 1008 on the left half of quadrant LL in Bank B0. The left and right halves of quadrants LL, LR RL and RR of Banks B0, B1, B2 and B3 are divided into like sections along these bit line divisions in all of the arrays of memory cells. The indications of DQ0, DQ15, DQ1, DQ14, DQ2, DQ13, DQ3 and DQ12 in array LL of Bank B0 indicates only generally the relative positions at which those data bits are stored in the arrays on chip 300.

In Bank B1, highlighted area 1010, extending the length of Bank B0, represents all of the individual word lines that are activated at one time in response to receipt of one group of row address signals. Thus, one address activates the same respective word lines in all of arrays 1017, 1018, 1020, 1022, 1024, 1026, 1028 and 1030 in Bank B1. Likewise, one row address will activate all the respective word lines in Banks 0, 2 or 3.

Across the center of chip 300, area 1012 represents the bond pads 334 for data bits DQ0–DQ15. The area 1014 represents the bond pads 336 for data bits DQ16–DQ31. Area 1016 represents the bond pads for the address signals, clock signals and control signals. Areas 1012, 1014 and 1016 provide an idealized representation of the bond pads for the data, address, clock and control signals for explanation purposes. The following Table 2 correlates the bond pad numbers with the acronyms of the signals they carry and the leads 104 to which they connect. There are more bond pads than leads to aid manufacturing the device.

TABLE 2

| Bond Pad Number | Acronym | Lead Number |
|---|---|---|
| 1 | Vsub | VSS |
| 2 | VSS | VSS |
| 3 | VDD | VDD |
| 4 | VDDref | VDD |
| 5 | VSSref | VSS 88 |
| 6 | VDDreg | VDD |
| 7 | VSS | VSS |
| 8 | DQ24 | 46 |
| 9 | DQ23 | 43 |
| 10 | VSSQ | VSS |
| 11 | VDDQ | VDD |
| 12 | DQ25 | 48 |
| 13 | DQ22 | 41 |
| 14 | VSSsa | VSS |
| 15 | VDDsa | VDD |
| 16 | DQ26 | 49 |
| 17 | DQ21 | 40 |
| 18 | VDDQ | VDD |
| 19 | VSSQ | VSS |
| 20 | DQ27 | 51 |
| 21 | DQ20 | 38 |
| 22 | VSS | VSS |
| 23 | VDDp | VDD |
| 24 | DQ28 | 52 |
| 25 | DQ19 | 37 |
| 26 | VSSQ | VSS |
| 27 | VDDQ | VDD |
| 28 | DQ29 | 54 |
| 29 | DQ18 | 35 |
| 30 | DQ30 | 55 |
| 31 | DQ17 | 34 |
| 32 | VDDQ | VDD |
| 33 | VSSQ | VSS |
| 34 | DQ31 | 57 |
| 35 | DQ16 | 32 |
| 36 | VSSsa | vss |
| 37 | VDDsa | VSS |
| 38 | DQM3 | VDD |
| 39 | DQM2 | 31 |
| 40 | VSSsa | VSS |
| 41 | VDDsa | VDD |
| 42 | A6 | 60 |
| 43 | A5 | 29 |
| 44 | A7 | 61 |
| 45 | A4 | 28 |
| 46 | VSSin | VSS |
| 47 | VDDin | VDD |
| 48 | VSSp | VSS |
| 49 | VDDp | VDD |
| 50 | A8 | 62 |
| 51 | A3 | 27 |
| 52 | A9 | 63 |
| 53 | VSSsa | VSS |
| 54 | VDDsa | VDD |

TABLE 2-continued

| Bond Pad Number | Acronym | Lead Number |
|---|---|---|
| 55 | A2 | 26 |
| 56 | A11 | 64 |
| 57 | A1 | 25 |
| 58 | BA0 | 67 |
| 59 | A0 | 24 |
| 60 | BA1 | 21 |
| 61 | A10/AP | 22 |
| 62 | NC | 72 |
| 63 | VSSsa | VSS |
| 64 | VDDsa | VDD |
| 65 | CS | 20 |
| 66 | VREF | 71 |
| 67 | RE | 16 |
| 68 | Vddp | VDD |
| 69 | VSSp | VSS |
| 70 | VSSin | VSS |
| 71 | VDDin | VDD |
| 72 | CKE | 68 |
| 73 | CE | 20 |
| 74 | CLK | 69 |
| 75 | W | 17 |
| 76 | VSSsa | VSS |
| 77 | VDDsa | VDD |
| 78 | DQM1 | 75 |
| 79 | DQM0 | 14 |
| 80 | VSSsa | VSS |
| 81 | VDDsa | VDD |
| 82 | DQ8 | 76 |
| 83 | DQ7 | 13 |
| 84 | VDDQ | VDD |
| 85 | VSSQ | VSS |
| 86 | DQ9 | 78 |
| 87 | DQ6 | 11 |
| 88 | DQ10 | 79 |
| 89 | DQ5 | 10 |
| 90 | VSSQ | VSS |
| 91 | VDDQ | VDD |
| 92 | DQ11 | 81 |
| 93 | DQ4 | 8 |
| 94 | VSSp | VSS |
| 95 | VDDp | VDD |
| 96 | DQ12 | 82 |
| 97 | DQ3 | 7 |
| 98 | VDDQ | VDD |
| 99 | VSSQ | VSS |
| 100 | DQ13 | 84 |
| 101 | DQ2 | 5 |
| 102 | VDD | VDD |
| 103 | VSSsa | VSS |
| 104 | DQ14 | 85 |
| 105 | DQ1 | 4 |
| 106 | VSSQ | VSS |
| 107 | VDDQ | VDD |
| 108 | DQ15 | 87 |
| 109 | DQ0 | 2 |
| 110 | VSSreq | VSS |
| 111 | VDDreq | VDD |
| 112 | VDDref | VDD |
| 113 | VSSref | VSS |
| 114 | VDD | 1 VDD |
| 115 | VSS | 88 |
| 116 | Vsub | VSS |

An important aspect depicted in FIG. 10 is the storage of data bits from each word of data in the same relative location in each of Banks B0, B1, B2 and B3. Thus data bits DQ0, DQ15, DQ1 and DQ14 are stored in the left half of quadrant LL in each of Banks B0, B1, B2 and B3. In a like manner data bits DQ22, DQ25, DQ23 and DQ24 are stored in like sections in the right half of quadrant RR of Banks B0, B1, B2 and B3. Note that data bit DQ0 is not stored only in section 1002, that data bit DQ15 is not stored only in section 1004, that data bit DQ1 is not stored only in section 1006, and that data bit DQ14 is not stored only in section 1008. The exact location for storage of these data bits will be described presently.

The right half 1018 of quadrant LL contains data bits DQ2, DQ3, DQ13 and DQ12. The left half 1020 of quadrant LR contains or stores data bits DQ4, DQ11, DQ5 and DQ10. The right half 1022 of quadrant LR stores data bits DQ6, DQ9, DQ7 and DQ8. The left half 1024 of quadrant RL stores data bits DQ16, DQ31, DQ17 and DQ30. The right half 1026 of quadrant RL stores data bits DQ18, DQ29, DQ19 and DQ28. The left half 1028 of quadrant RR stores data bits DQ20, DQ27, DQ21 and DQ26. The right half 1030 of quadrant RR stores data bits DQ22, DQ25, DQ23 and DQ24.

Figure 11:
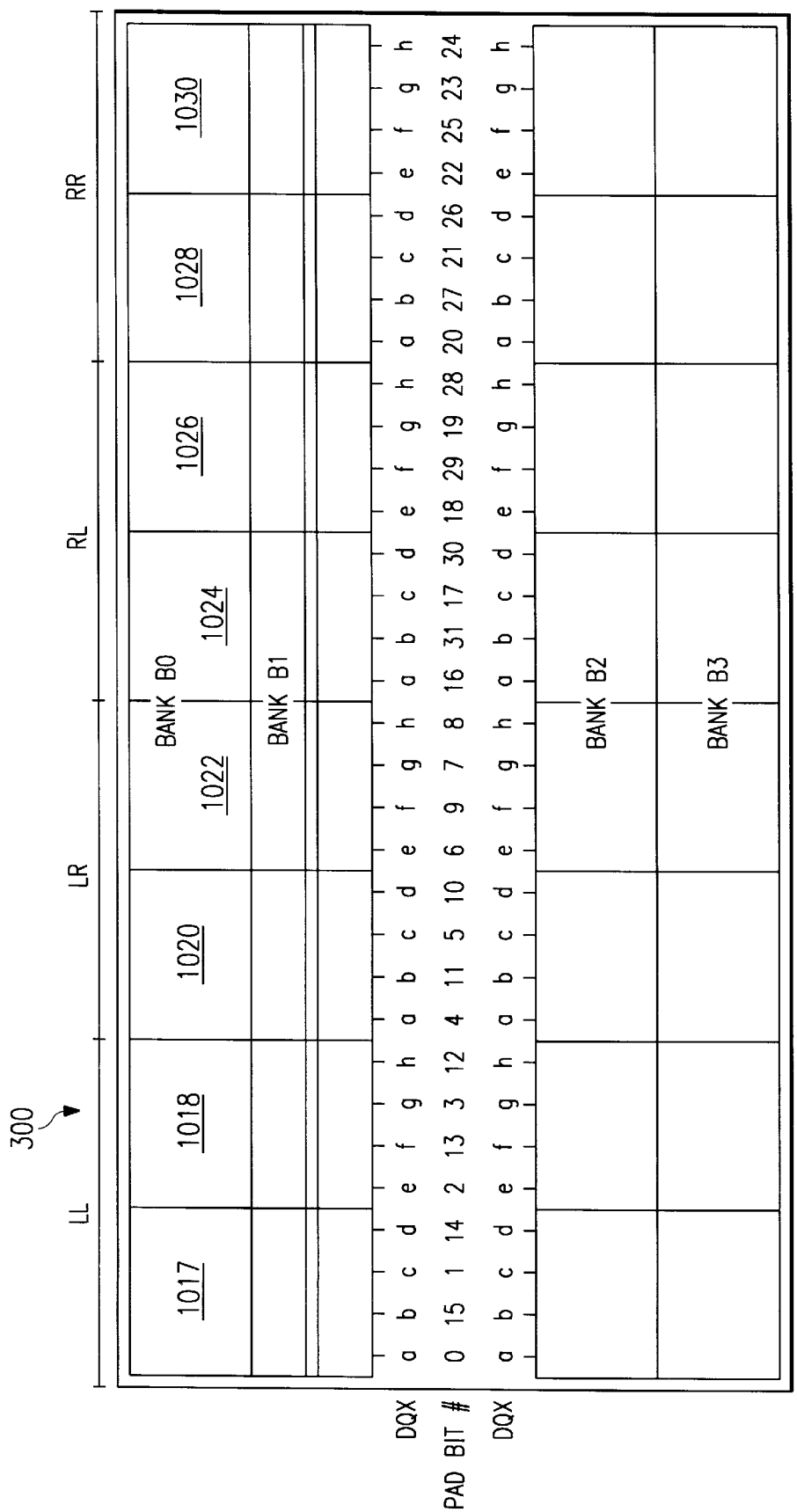
FIG. 11 is a block diagram indicating assignment of data signals to bond pads and corresponding data signal leads on the chip.

In FIG. 11, each of the quadrants LL, LR, RL and RR in Banks B0, B1, B2 and B3 provide eight data bit output leads, DQx, where "x" is identified by the letters a, b, c, d, e, f, g and h. These lettered data output leads connect to respective bond pads for the numbered data bits. For example, in the LL quadrant, data lead a connects with bond pad bit number 0, data lead b connects with the bond pad for bit number 15, data lead c connects with the bond pad for bit number 1, data lead d connects with the bond pad for bit number 14, data lead e connects with the bond pad for data bit number 2, data lead f connects with the bond pad for bit number 13, data lead g connects with the bond pad for bit number 3 and data lead h connects with the bond for data bit number 12.

In a like manner, the lettered data leads for the other quadrants connect with the bond pads for the rest of the data bit numbers. Notice that this connection of lettered data leads from the quadrants substantially aligns with the bond pads for the respective bit numbers. This alignment substantially reduces the length or distance that the data leads must extend from the arrays of memory cells to the bond pads. Thus the data signals received on any one bond pad are stored in arrays generally extending across the width of the chip 300 from that bond pad. The data signals travel only minimally across the length of the chip.

In more formal terms, bond pads on the substrate extend along the length of the chip 300 to carry data signals to and from the device and the bond pads are carrying the data signals in a certain order. The arrays of memory cells are formed on the chip 300 and extend across the width of the substrate in sections or groups of memory cells. Each group of memory cells stores the data signals carried by one group of bond pads and the groups of memory cells are arranged on the substrate in a defined order that is substantially the same as the order in which the bond pads carry the data signals.

Figure 12:
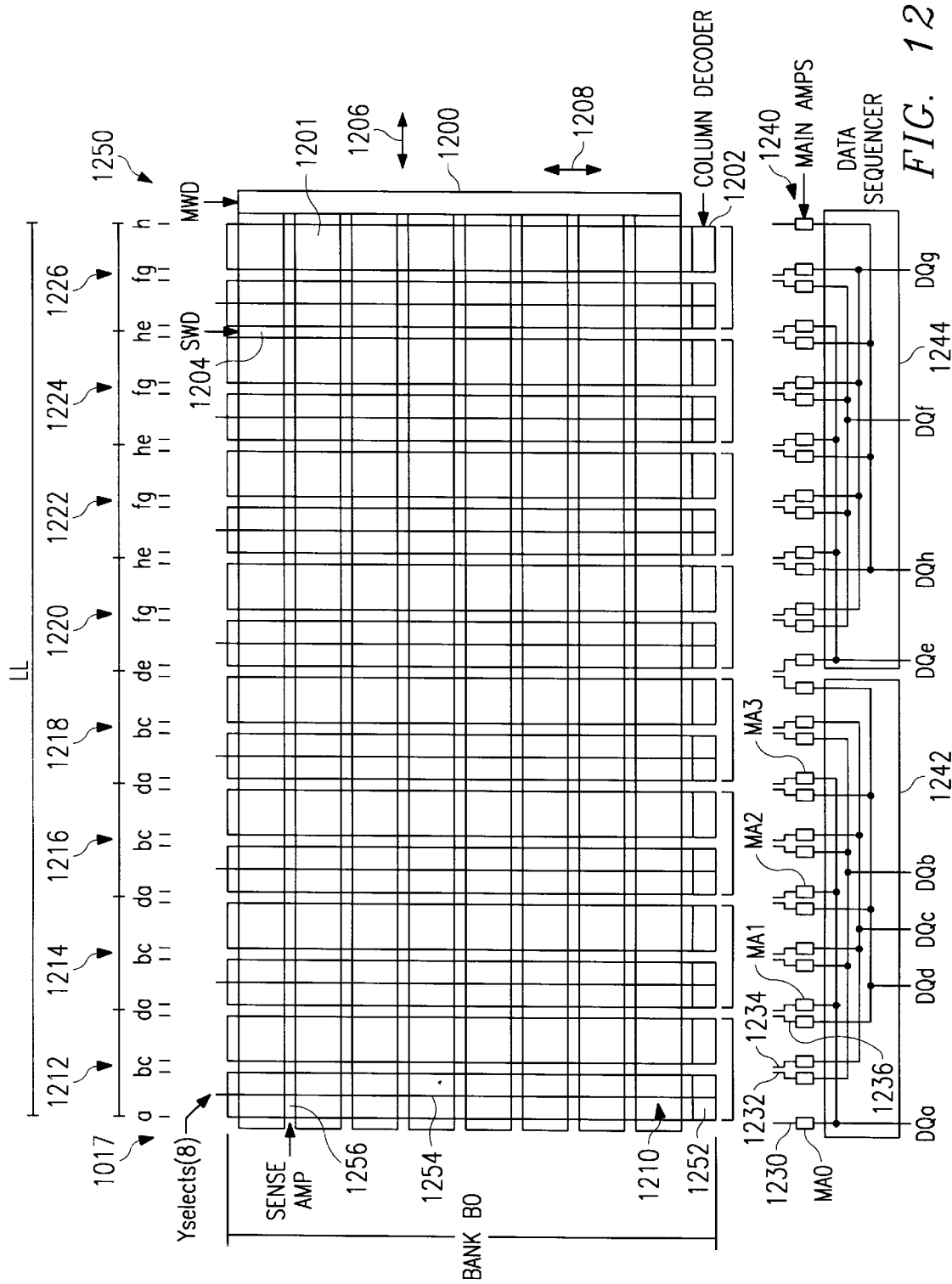
FIG. 12 is a block diagram indicating the arrangement of column select, MIO or global I/O lines and memory cell arrays in quadrant LL, bank B0.

In FIG. 12, quadrant LL in Bank B0 contains one hundred twenty-eight memory cell arrays, such as array 1201, arranged in a matrix of eight rows of arrays by sixteen columns of arrays. A main word decoder MWD occurs along the right side of the eight rows of arrays while sixteen Column Decoders such as Column Decoder 1202 occur at the bottoms of the respective columns of arrays. Sub word decoders SWD such as Sub word decoder 1204 occur between the columns of arrays to generate word line decode signals in the direction of arrow 1206. The bit lines run across each of the arrays in the direction of arrow 1208.

The columns of arrays, such as column 1210, are arranged in pairs, such as column pairs 1212, 1214, 1216, 1218, 1220, 1222, 1224 and 1226. The pairs 1212, 1214, 1216 and 1218 comprises the left half of quadrant LL while the pairs 1220, 1222, 1224 and 1226 comprise the right half of quadrant LL. Each pair of columns store the data bits for the four lettered data bits identified in FIG. 11. The pairs of columns 1212, 1214, 1216 and 1218 each store the data signals for data bits a, b, c and d. Pairs of columns 1220, 1222, 1224 and 1226 each store the data signals for data bits e, f, g and h.

For each pair of columns, such as column pair 1212, four main I/O lines, such as main I/O lines 1230, 1232, 1234 and 1236 extend along the column of arrays and emerge below the column decoder circuits. These main I/O lines connect to main amplifiers 1240. For each column pair of arrays, the main I/O lines connect to main amplifiers for the respective lettered data bits. Thus, for column pair 1212, main I/O line 1230 connects to main amplifier MA0-a, main I/O line 1232 connects to main amplifier MA0-b, main I/O line 1234 connects to main amplifier MA0-c, and main I/O line 1236 connects to main amplifier MA0-d.

For column pair 1214, the first main I/O line connects to main amplifier MA1-a, the second main I/O line connects to main amplifier MA1-b, the third main I/O line connects to main amplifier MA1-c, and the fourth main I/O line connects to main amplifier MA1-d. In a like manner, the four main I/O lines extending from the column pair 1216 connect to main amplifiers MA2-a through MA2-d and the four main I/O lines extending from column pair 1218 connect to main amplifiers MA3-a through MA3-d.

Like connections occur for the main I/O lines extending from columns 1220 through 1226 to their respective main amplifiers.

The outputs of the main amplifiers for column pairs 1212, 1214, 1216 and 1218 connect to a data sequencer 1242. The outputs of the main amplifiers for column pairs 1220, 1222, 1224 and 1226 connect to data sequencer 1244. The output of data sequencer 1242 comprises four data bit lines DQa, DQb, DQc and DQd. The outputs of data sequencer 1244 comprise four data bit lines DQe, DQf, DQg and DQh.

Data sequencers 1242 and 1244 comprise parts of data circuits 340 or 342, see FIG. 3. The connecting lines within data sequencers 1242 and 1244 functionally indicate a selection of data signals from the main amplifiers to one of the four respective data bit lines. This will be more fully explained in a following drawing figure.

FIG. 12 depicts main I/O lines extending along the pairs of columns in quadrant LL of bank B0. The main I/O lines depicted in FIG. 12 also extend along the pairs of columns in quadrant LL of bank B1 to main amplifiers located near data circuits 340, which are located near the bond pads on chip 300. Additional and like main I/O lines extend along all of the pairs of columns in all of the quadrants of banks B0 and B1 to additional main amplifiers. In a like manner, additional main I/O lines extend along the pairs of columns of memory arrays in banks B2 and B3.

At area 1250, FIG. 12 provides a functional indication of the lettered data bit carried by the four main I/O lines for each pair of columns. Thus the left-most main I/O lines in column pairs 1212, 1214, 1216 and 1218 carry the data bit appearing on lead DQa through main amplifiers MA0-a, MA1-a, MA2-a and MA3-a. The right-most main I/O lines in column pairs 1212, 1214, 1216 and 1218 carry the data bit appearing on lead DQd through main amplifiers MA0-d, MA1-d, MA2-d and MA3-d. In a like manner, the two center main I/O lines carry the data bits appearing on respective leads DQb and DQc.

The left-most main I/O lines in column pairs 1220, 1222, 1224 and 1226 carry the data bit appearing on lead DQe through their respective main amplifiers. The right-most main I/O lines in column pairs 1220, 1222, 1224 and 1226 carry the data bit appearing on lead DQh through their respective main amplifiers. In a like manner, the two center main I/O lines carry the data bits appearing on respective leads DQf and DQg.

This construction and arrangement provides a pre-fetch column select access of four data bits for each data line DQa–DQh at one time. Data sequencers 1242 and 1244 provide for the ordered presentation of the data bits to their outputs. Thus a four bit pre-fetch of data bits occurs for each column address applied to chip 300 and corresponding set of generated word line signals.

The column decoders for a pair of columns, such as 1202 and 1252, produce one active Y-select line, represented by Y-select line 1254, extending across the arrays of memory cells in that pair of columns. Sense amplifiers occur in sense amp areas 1256 between the arrays of memory cells.

With this four bit pre-fetch scheme, memory device 100 can provide eight bits of data for each address in an eight bit burst. An eight bit burst comprises two memory cycles. Each memory cycle comprises a fetch of four bits of data for each data I/O bit and each memory cycle occurs in four clock cycles. A burst of four bits operates in one memory cycle of 4 clock cycles. A burst of two bits operates in one memory cycle accessing four data bits but uses only two clock cycles to output the data. A one bit output comprises one memory cycle and one clock cycle.

Figure 13:
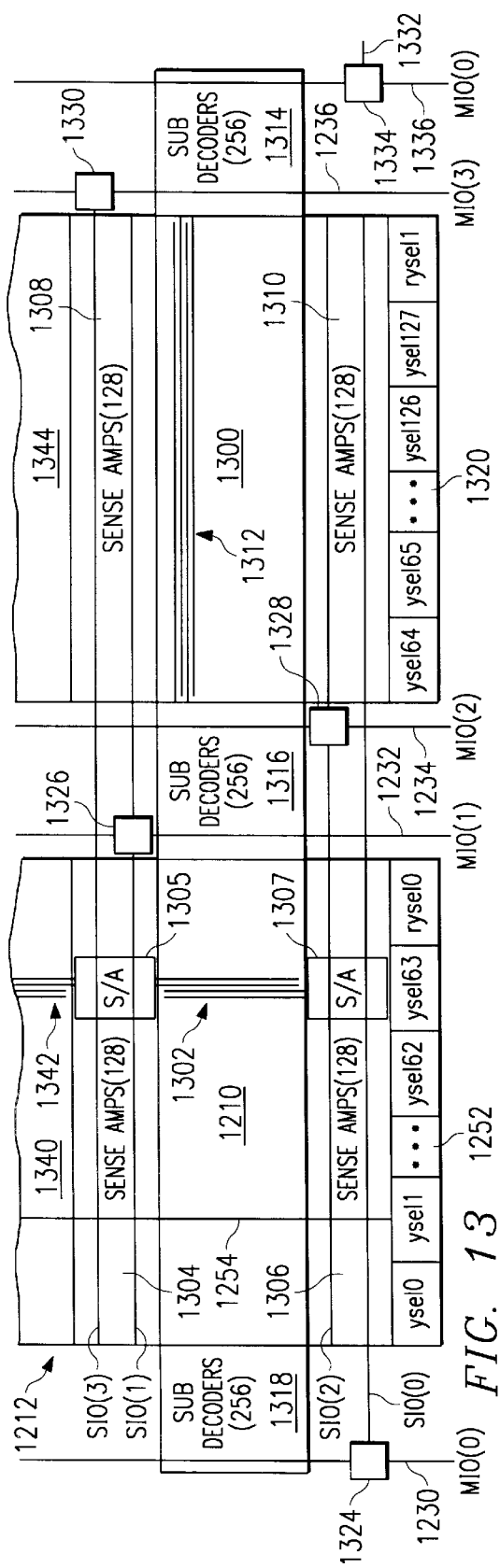
FIG. 13 is an enlarged block diagram of a part of the data lines and memory cell arrays of FIG. 12.

In FIG. 13, column pair 1212 comprises arrays of memory cells 1210 and 1300 each containing memory cells located at the intersections of word lines and bit lines. Array 1210 contains bit lines, such as four bit lines 1302, extending along side one another in an alternating arrangement. Two bit lines extend from sense amp array 1304 and particularly sense amp 1305 and two bit lines extend up from sense amp array 1306 and particularly sense amp 1307. Each of sense amp arrays 1304 and 1306 and the other sense amp arrays contain one hundred twenty-eight sense amplifiers, such as sense amps 1305 and 1307, arranged in shared alternating sense amp configurations. Sense amp arrays 1308 and 1310 connect to like bit lines extending across array 1300.

In array 1300, four sub word lines 1312 extend across the array in an interleaved arrangement. Two of the sub word lines extend from sub decoder array 1314 and the other two word lines extend from sub decoder array 1316. Sub decoder arrays 1314 and 1316 contain 256 sub decoders producing active select signals on the sub word lines. In a like manner, sub decoder arrays 1316 and 1318 produce active select signals on sub word lines extending across array 1210.

Column decoder circuits 1252 and 1320 each generate sixty-five Y select signals in sixty-four Y select circuits yse10–yse1127 and one redundant Y select circuit ryse10. The Y select signals occur on lines, such as Y select line 1254, that extend across arrays 1210 and 1300 respectively and continue extending across the entire column of arrays of memory cells. Column address signals A8 through A0 are used to generate the active Y select signals yse10–yse1127. Only one of the Y select signals produced from column decoder circuits 1252 and 1320 is active at one time.

The column decoder circuits 1252 and 1320 receive column factor signals, not shown, decoded from the column address signals applied externally to chip 300. The Y select circuits are paired and the column factor signals are applied to the column select circuits to facilitate operation of the memory device in two sequential memory cycles. One received column address decodes into an initial set of column factor signals. The column factor signals select one of the paired Y select circuits in a first memory cycle and select the other paired Y select circuit by simply inverting the column factor signals. This arrangement facilitates reading data from the memory device in an eight bit burst by accessing four bits of data in each of two sequential memory cycles.

For example a column address could normally decode into column factor signals that select Y select circuits yse10 in a first memory cycle. In the second memory cycle the column factor signals become inverted and select Y select circuits yse11. For burst lengths of 1, 2 or 4 bits of data, only one memory cycle is needed to access the addressed data so the second memory cycle does not occur.

Each Y select signal line extending from column decoder 1252 selects four data signals from array 1210. Each Y select signal line extending from column decoder 1320 selects four data signals from array 1300. The selection occurs through circuits located in the sense amplifiers in the sense amp arrays. The four data signals decoded from the sense amps in sense amp arrays 1304, 1306, 1308 and 1310 appear on Sub I/O lines SIO(0), SIO(1), SIO(2) and SIO(3). The data signal that appears on the sub I/O line SIO(0) connects to mid-amplifier 1324. In a like manner the sub I/O line SIO(1) connects to mid-amplifier 1326. The sub I/O line SIO(2) connects to mid-amplifier 1328 and sub I/O line SIO(3) connects to mid-amplifier 1330. The sub I/O lines pass over the sense amplifier arrays 1304, 1306, 1308 and 1310 generally in a direction parallel to the word lines 1312.

Mid-amplifier 1324 connects the sub I/O line SIO(0) to main I/O line MIO(0) 1230. Mid-amplifier 1326 connects the sub I/O line SIO(1) to main I/O line MIO(1) 1232. Mid-amplifier 1328 connects sub I/O line SIO(2) to main I/O line MIO(2) 1234. Mid-amplifier 1330 connects sub I/O line SIO(3) to main I/O line MIO(3) 1236. In addition, another sub I/O line 1332 from another array (not depicted) to the right of array 1300 connects to another mid-amplifier 1334. Mid-amplifier 1334 in turn connects to main I/O line MIO(0) 1336 for the next column pair of arrays.

The two arrays 1210 and 1300 of memory cells comprise the bottom two arrays in the pair of columns of memory cell arrays 1212 depicted in FIG. 12. Eight arrays exist in each column. Array 1340 exists above array 1210 and bit lines 1342 extend in that array. Array 1344 occurs above array 1300. Separate sub I/O lines occur over the sense amplifier arrays between the memory cell arrays in each column. The four main I/O lines extend the length of the pair of columns in bank B0 and extend the length of a respective pair of columns in bank B1 to couple to all the sub I/O lines in those two column pairs in those two banks. This arrangement provides short sub I/O lines and main I/O lines to reduce the parasitic capacitances occurring in those lines.

The arrangement of column pair 1212 is the same as all of the other column pairs on chip 300, so a description of one is a description of all. The main I/O lines carry the data signals for the lettered data bits a, b, c and d described in FIG. 12. The main I/O line MIO(0) 1230 carries data signals for the data bit a. Main I/O line MIO(1) 1232 carries data signals for the data bit b. Main I/O line MIO(2) 1234 carries data signals for the data bit c; and main I/O line MIO(3) 1236 carries data signals for the data bit d. Data bits a, b, c and d thus are stored in the column pairs of arrays in an ordered manner.

Figure 14:
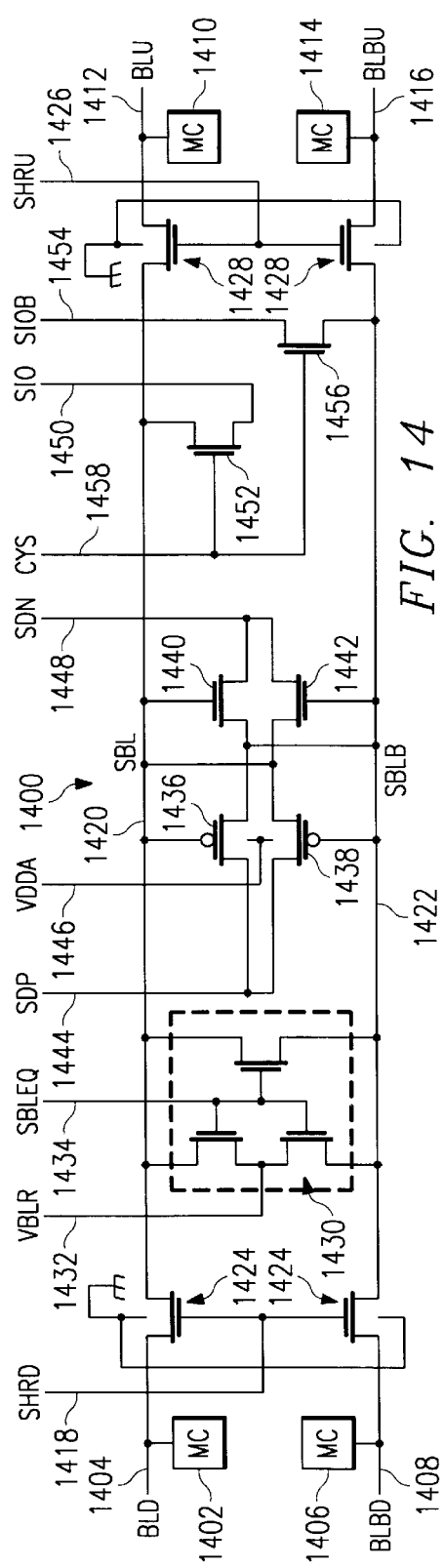
FIG. 14 is a schematic diagram of a sense amp or amplifier used on the chip.

In FIG. 14, sense amplifier circuit 1400 comprises one of the sense amplifier circuits used on chip 300. Memory cell 1402 connects to bit line down BLD 1404. Memory cell 1406 connects to bit line bar down BLBD 1408. In a like manner, memory cell 1410 connects to bit line up BLU 1412, and memory cell 1414 connects to bit line bar up BLBU 1416. A signal SHRD on line 1418 couples the bit line down BLD 1404 and bit line bar down BLBD 1408 to their respective sub bit lines 1420 and 1422 through a pair of pass transistors 1424. In a like manner a signal SHRU on lead 1426 couples the bit line up BLU 1412 and the bit line bar up BLBU 1416 to the sub bit lines 1420 and 1422 through a pair of pass transistors 1428.

An equalize circuit 1430 connects across the sub bit line SBL 1420 and sub bit line bar SBLB 1422 in conjunction with signals VBLR on lead 1432 and signal SBLEQ on lead 1434 to equalize the voltage on the two sub bit lines at a desired time. A sense amplifier formed of cross coupled P transistors 1436, 1438 and N-channel transistors 1440 and 1442 connect to the sub bit line SBL 1420 and the sub bit line bar SBLB 1422. The two P-channel transistors 1436 and 1438 also connect to a signal SDP on lead 1444 and VDDA on lead 1446. The two N-channel transistors 1440 and 1442 connect to a signal SDN on lead 1448.

The sub bit line SBL 1420 connects to the sub I/O line 1450 through transistor 1452 and the sub bit line bar SBLB 1422 connects to the sub I/O line bar SIOB 1454 through transistor 1456. The column Y select signal CYS on lead 1458 controls the connection of the bit lines to the sub I/O lines.

Figure 15:
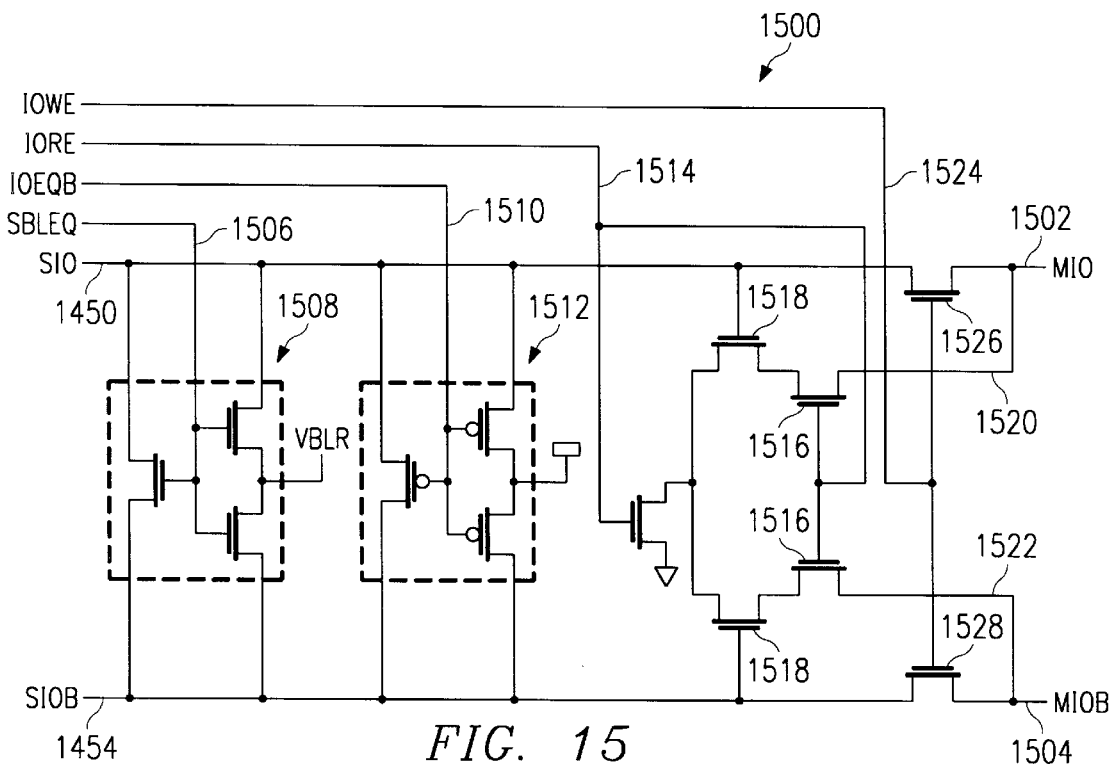
FIG. 15 is a schematic diagram of a mid amp or amplifier circuit used on the chip.

In FIG. 15, mid amplifier 1500 connects or couples the sub I/O lines 1450 and 1454 to main I/O lines 1502 and 1504. A sub bit line equalize signal SBLEQ on lead 1506 controls an equalize circuit 1508 to equalize the voltage on the sub I/O lines 1450 and 1454. In I/O equalize bar signal IOEQB on lead 1510 controls an I/O equalize circuit 1512 connected between the sub I/O lines 1450 and 1454.

An I/O read enable signal IORE on lead 1514 controls pairs of transistors 1516 and 1518. The pairs of transistors 1516 and 1518 couple the logical level on sub I/O lines SIO 1450 and 1454 to the main I/O lines 1502 and 1504 through leads 1520 and 1522. The signal I/O write enable IOWE on lead 1524 controls a pair of pass transistors 1526 and 1528 in driving the sub I/O lines 1450 and 1454 directly from the main I/O lines 1502 and 1504 during a writing of data into the memory cells. The reading of data from the memory cells to the main I/O lines occurs through the transistor pairs 1516 and 1518.

Figure 16:
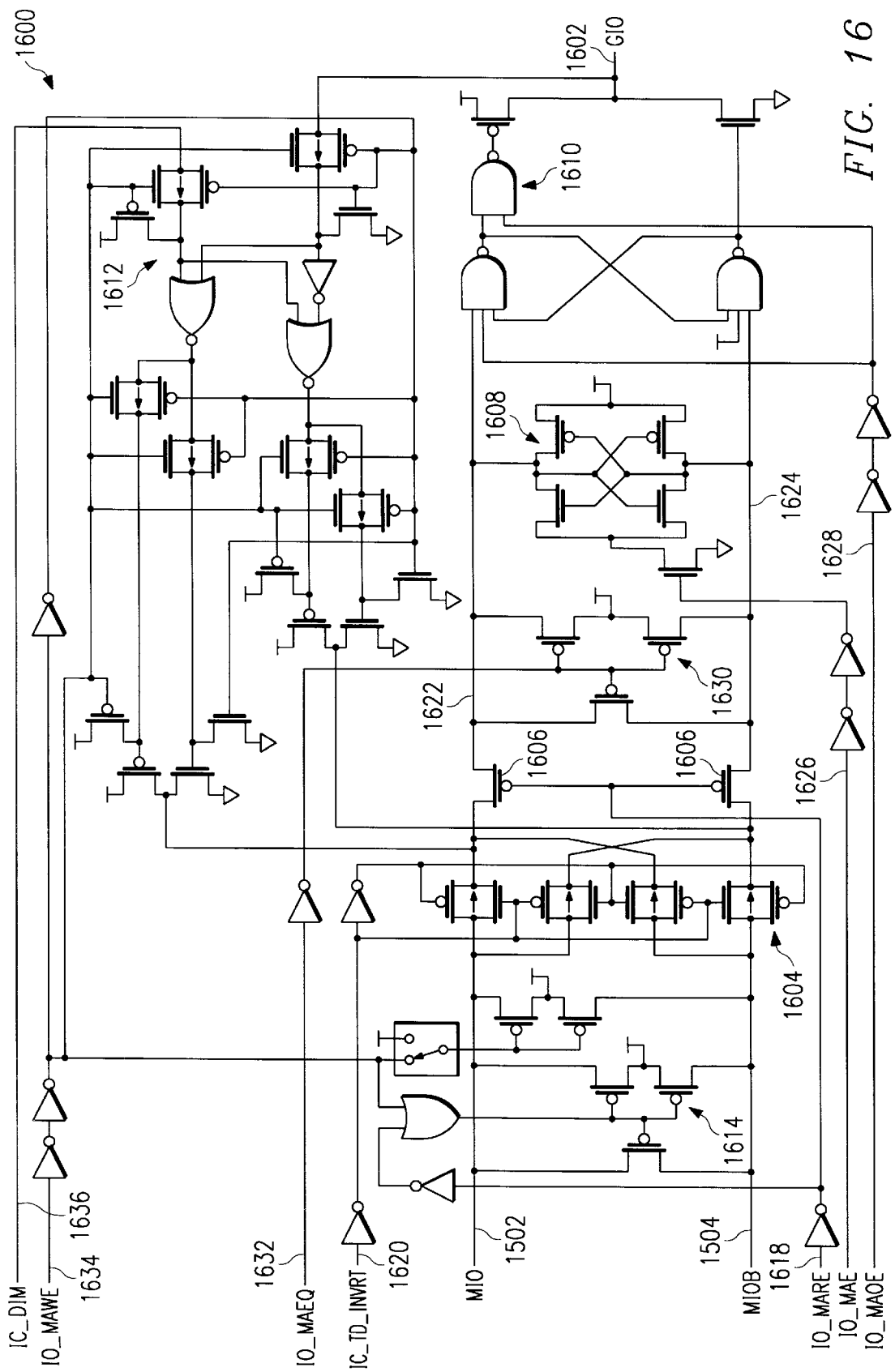
FIG. 16 is a schematic diagram of a main amp or amplifier circuit used on the chip.

In FIG. 16, main amplifier 1600 electrically couples the main I/O lines 1502 and 1504 to a global I/O line 1602. When reading data from a memory cell, the data path occurs generally through four data inverter pass circuits 1604, pass transistors 1606, main sense amplifier 1608 and data output circuits 1610 to the global I/O line 1602. When writing data from the global I/O line 1602 to the main I/O lines 1502 and 1504 the data path occurs generally through write circuits 1612 to the data inverter pass circuits 1604.

Voltage equalize circuits 1614 equalize the voltage on the main I/O lines MIO and MIOB 1502 and 1504 respectively. This occurs in conjunction with the I/O main amp read enable signal IO_MARE on lead 1618. The data inverter pass circuits 1604 are controlled generally by the signal IC_TD_INVRT on lead 1620. The pair of pass transistors 1606 connecting the main I/O lines 1502 and 1504 to internal bit lines 1622 and 1624 are controlled through the I/O main amp read enable signal IO_MARE on lead 1618. The main sense amplifier circuits 1608 are controlled through the signal I/O main amp enable IO_MAE on lead 1626. The main sense amplifiers 1608 connect to the internal bit lines 1622 and 1624 to sense and latch their respective voltages.

The output circuits 1610 are controlled by the signal I/O main amp output enable IO_MAOE on lead 1628. An equalization circuit 1630 between the internal bit lines 1622 and 1624 is controlled by an I/O main amplifier equalize signal IO_MAEQ on lead 1632. The write circuits 1612 are controlled generally through the signal I/O main amplifier write enable IO_MAWE on lead 1634. The write circuits 1612 are also controlled by a signal IC_DIM on lead 1636.

Figure 17A:
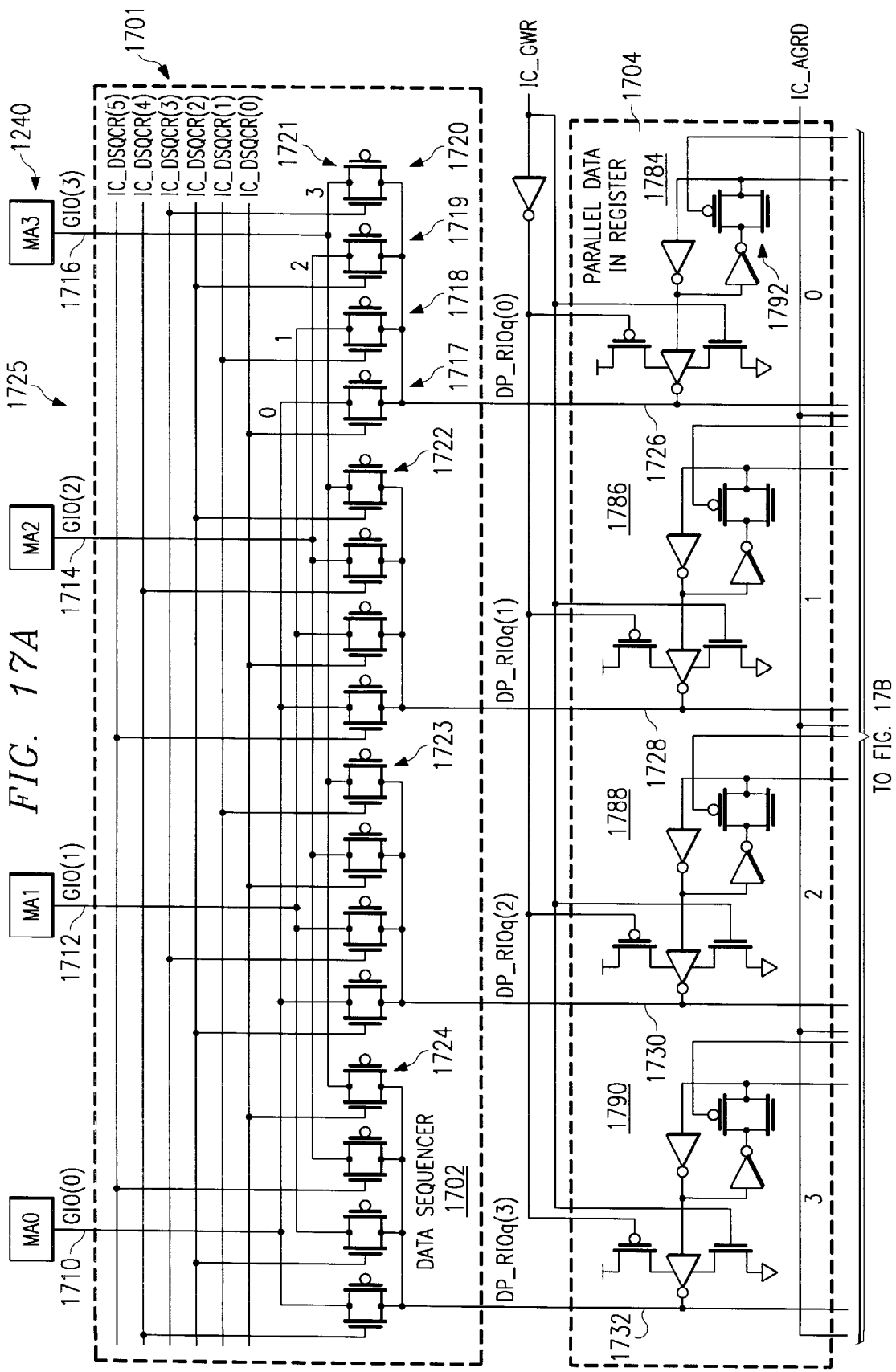
FIG. 17 is a block and schematic diagram of data circuits between four main amplifiers and one data bond pad.
Figure 17B:
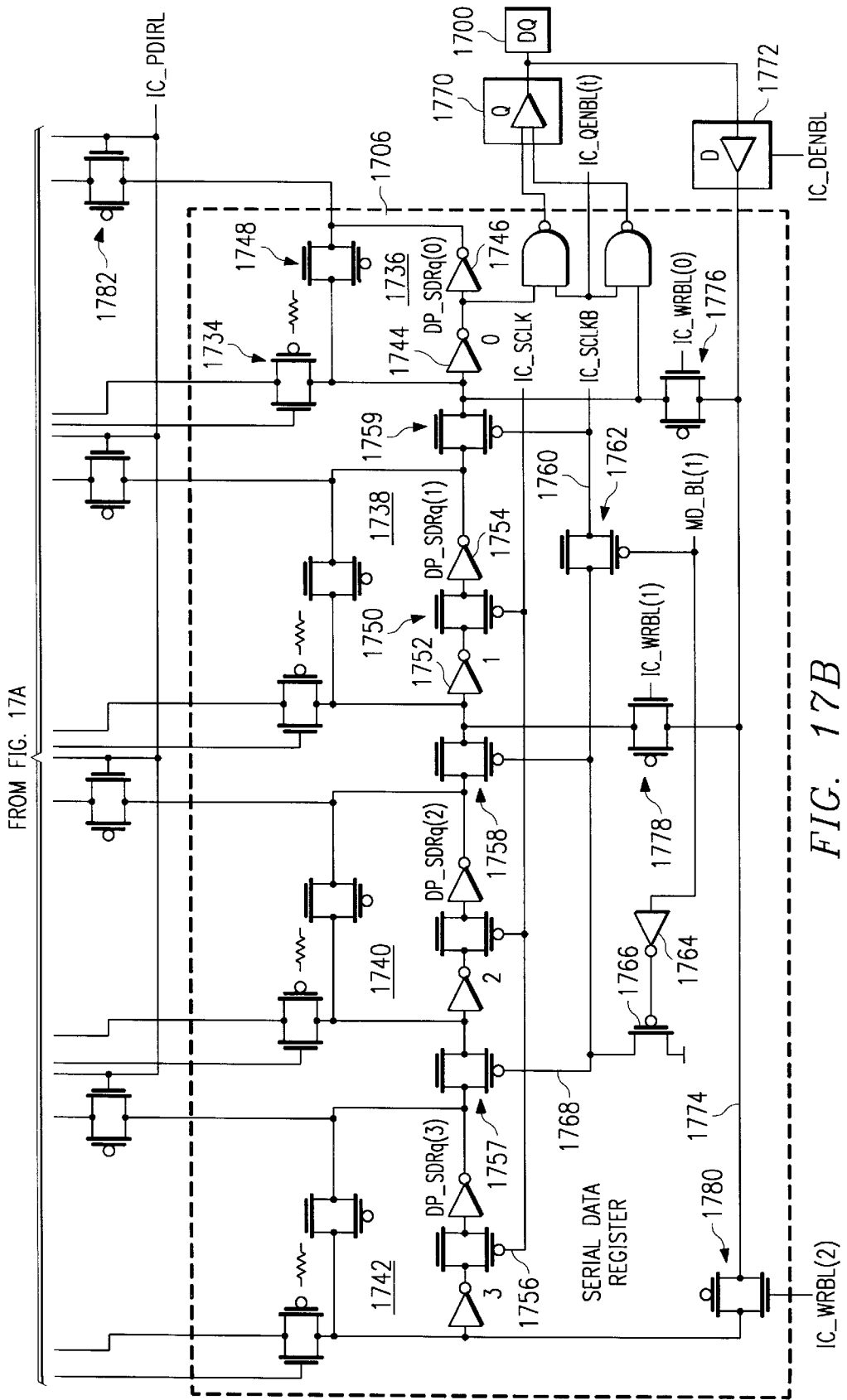

In FIG. 17, the depicted circuits provide for transfer of one data between the DQx bond pad 1700 and the main amplifiers 1240 in sequences or bursts of 1, 2, 4 or 8 bits of data. One DQx, where x is a number from 0 through 31, bond pad exists on chip 300 for each data bit. The data passes between main I/O amps 1240 and DQx bond pad 1700 through data circuits 1701 comprising data sequencer 1702, parallel data in register 1704 and serial data register 1706. Data circuits 1701 comprise the data circuits 340 and 342 described in FIG. 3. These data circuits 1701 provide the actual embodiments of the functional representations depicted in sequencers 1242 and 1244 of FIG. 12.

In reading data from the arrays of memory cells, the data sequencer 1702 and serial data register 1706 contribute to operation of chip 300. In writing data to the arrays of memory cells, the serial data register 1706, the parallel data in register 1704 and the data sequencer 1702 contribute to operation of the chip 300. Main amps MA0, MA1, MA2 and MA3 are the same main amps for one lettered data bit depicted in FIG. 12.

In reading data from the memory cells, the main amplifiers 1240 MA0, MA1, MA2 and MA3 produce data signals on data path global I/O lines GIO(0)–GIO(3), 1710–1716, respectively. Each global I/O line connects to one side of a pair of pass transistors, such as respectively pass transistors 1717, 1718, 1719 and 1720. The pairs of pass transistors 1717–1720 are grouped in a set 1721 and there are four sets of pass transistors 1721, 1722, 1723 and 1724. The other side of the pairs of pass transistors couple the data signals to the serial data register 1706.

The sets of pairs of pass transistors 1721, 1722, 1723 and 1724 are controlled by I/O control data sequencer signals IC_DSQCR(0)–(5) on leads 1725. By opening selected pairs of pass transistors, the I/O control data sequencer signals on leads 1725 determine the parallel order in which data signals pass from the global I/O lines to the serial data register. This arranges the data signals from the main I/O amplifiers to be in the required order in serial or interleaved mode. The I/O control data sequencer signals are generated at another part of the chip 300 in response to mode control and address control signals to be discussed. Column address signals A1 and A0 are used to produce select signals for selecting the data from the main amplifiers.

The pass transistors, such as pass transistor 1717, each comprise an N-channel transistor and a P-channel transistor connected in parallel. A control signal to the pair of parallel connected transistors is depicted in FIG. 17 with a lead line drawn only to the gate of the N-channel transistor. An inverted control signal also connects to the gate of the P-channel transistor but is not depicted to simplify the drawing figure for explanation.

After passing through the sets of pass transistors 1721, 1722, 1723 and 1724 the data signals travel on leads 1726, 1728, 1730 and 1732 respectively to pairs of pass transistors such as pass transistors 1734. Pairs of pass transistors 1734 are controlled by an I/O control asynchronous ganged read signal IC_AGRD.

In serial data register 1706, four data latches 1736, 1738, 1740 and 1742 respectively receive the outputs from the pairs of pass transistors such as the pair of pass transistors 1734 and latch the received data signals. Latch 1736 comprises a pair of inverters 1744 and 1746 connected in series with a delayed pair of pass transistors 1748 providing connection from the output of inverter 1746 back to the input of inverter 1744.

Latch 1738 is similar to latch 1736 but additionally comprises a pair of pass transistors 1750 between the output of inverter 1752 and the input of inverter 1754. Latches 1740 and 1742 are like latch 1738. The pair of pass transistors 1750 are controlled by a signal I/O control shift clock IC_SCLK on lead 1756.

A pair of pass transistors 1757 connect the output of latch 1742 to the input of latch 1740. A pair of pass transistors 1758 connect the output of latch 1740 to the input of latch 1738, and pass transistors 1759 connect the output of latch 1738 to the input of latch 1736. These pass transistors 1757, 1758 and 1759 are controlled by a signal I/O control shift clock bar IC_SCLKB on lead 1760.

A signal mode decode burst length MD_BL(1) connected to pass transistor pair 1762 controls propagation of the signal I/O control shift clock bar IC_SCLKB to the pass transistors 1757, 1758 between latches 1742, 1740 and 1738. Inverter 1764 and pull up transistor 1766 maintain lead 1768 in a high state to prevent shifting of data between latches 1742 and 1740 and between latches 1740 and 1738 if MD_BL(1) is high.

The serial clock signals on leads 1756, 1760 and 1768 provide for clocking of data bits through the data latches to the output data buffer 1770 and then to bond pad 1700. An output buffer enable signal IC_QENBL enables the output data buffer 1770.

During a read operation the data signals from the main amplifiers and data path global I/O lines are arranged in a desired sequence through operation of data sequencer 1702 and latched in serial data register 1706. In serial data register 1706, the data signals are clocked in response to clock signals through the output data buffer 1770 to the bond pad 1700.

During a write operation, a data signal appearing on bond pad 1700 passes through data in buffer 1772 in conjunction with the I/O control data in enable signal IC_DENBL. The output of the data buffer 1722 appears on lead 1774 and connects to three sets of pass transistors 1776, 1778 and 1780. Each of these pairs of pass transistors receive control signals indicating the desired burst length and the control signals are identified as IC_WRBL(0), IC_WRBL(1) and IC_WRBL(2) respectively for burst lengths of one bit, two bits and four bits or eight bits.

Thus if one bit of data is to be written to the memory cell arrays from lead 1774 for burst length of one, only pass transistors 1776 are enabled and that bit passes into latch 1736. If two bits of data are to be written, the first bit passes through pass transistors 1778 into latch 1738 and on the next timed clock signal the first data bit passes into latch 1736; the second data bit passes through pass transistors 1778 into latch 1738, after it is presented on bond pad 1700.

If four bits of data are to be latched in series, they pass through pass transistor 1780 into latches 1742, 1740, 1738 and 1736 in timed conjunction with received clock signals.

After the data has been latched into the serial data register latches, it passes into respective latches in parallel data in register 1704. Thus the data stored in latch 1736 passes through pass transistors 1782 into latch 1784. A signal I/O control parallel data in register latch (IC_PDIRL) controls pass transistors 1782. The data in latch 1738 passes through like pass transistors into latch 1786. The data stored in latch 1740 passes through like pass transistors into latch 1788, and the data stored in latch 1742 passes through like pass transistors into latch 1790.

Each of the latches 1784, 1786, 1788 and 1790 comprise a pair of circular connected inverters with a pair of pass transistors, such as 1792, connecting the output of one inverter to the input of the other inverter. These pass transistors effectively enable each parallel data in register latch. Each parallel data in register latch also comprises a data driver circuit comprising an inverter and P-channel and N-channel transistors in totem pole configuration. A signal I/O control ganged write controls the P-channel and N-channel transistors. The output of latch 1784 connects to data lead 1726. The output of data latch 1786 connects to data lead 1728. The output of data latch 1788 connects to data lead 1730, and the output of data latch 1790 connects to data lead 1732.

From these data leads, the data signals pass through the pairs of pass transistors in data sequencer 1702 to arrange the data in any required sequence and then the data signals pass across the global I/O lines into the main amplifiers MA0–MA3 for transmission into the arrays of memory cells.

Thus during a write operation, the data bits pass from the bond pads 1700 into selected latches in serial data register 1706. From there the data pass into respective latches in parallel data in register 1704, is placed in a selected data sequence through data sequencer 1702 and is carried to the arrays of memory cells through the main I/O amplifiers 1240.

There is one set of data circuits 1701 for each bond pad 1700 of bond pads 334 and 336 of FIG. 3. There are two sets of main amplifiers 1240 for each set of data circuits 1701. One set of main amplifiers transmits data signals between the data circuits and the memory arrays in banks B0 and B1. The other set of main amplifiers transmits data signals between the data circuits and the memory arrays in banks B2 and B3. One set of global data lines connects the two sets of main amplifiers to the one set of data circuits. The outputs of the main amplifiers present a high impedance to the global data lines when unselected.

Figure 18:
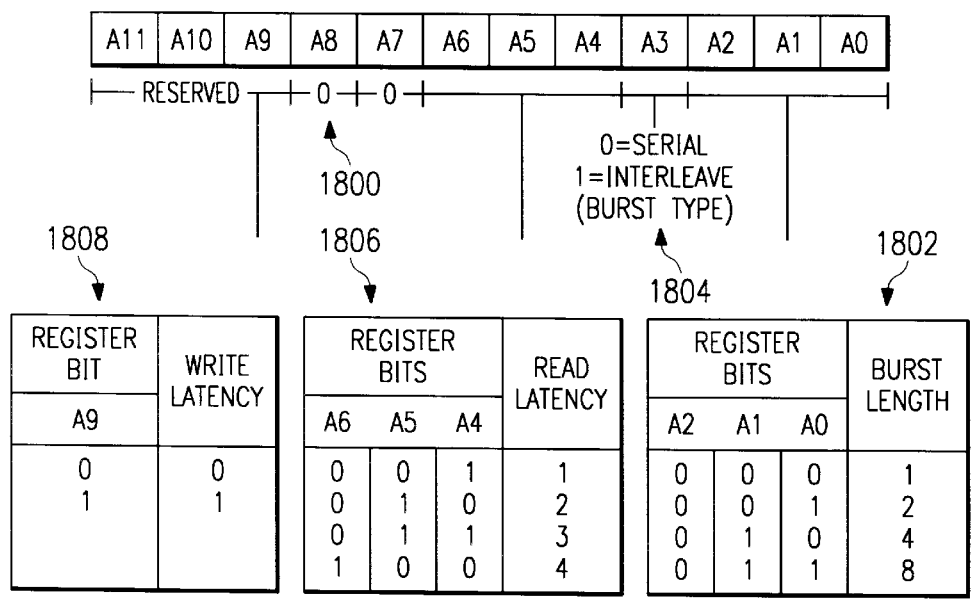
FIG. 18 is a chart indicating standard control bits for operating a synchronous DRAM.

In FIG. 18, memory device 100 contains a mode register 1800 that should be programmed by the user before using the memory device. The mode register 1800 contains individual data bits indicating a read latency, a burst type, a burst length and write latency. The mode register is loaded with a mode register set command executed by holding RAS_, CAS_ and W_ low with the input mode word being valid on address leads A0–A8 on the rising edge of a clock signal. The mode register set MRS command can be executed only when all banks are deactivated and in their idle state.

A logic zero should always be entered on address lead A7 and A8, while address leads A10–A11, BA0, BA1 are don't care entries for the mode register. Chart 1802 indicates the allowed logical states for mode register bits A0–A2 in determining a burst length of 1, 2, 4 or 8 bits. Chart 1804 indicates that a mode register bit A3 of zero indicates a serial burst type while a logical one indicates an interleave burst type. Chart 1806 indicates the mode register bits A4–A6 determining a read latency respectively of 1, 2, 3 and 4. Chart 1808 indicates the mode register bit A9 determining a write latency of zero and one, respectively. The mode register is changed only if a valid MRS command is entered. If the addresses are not valid, the previous contents of the mode register will remain unchanged.

All data for the memory device 100 is written or read in a burst fashion. A single starting addresses is entered into the device and then the memory device 100 internally addresses a sequence of locations based on that starting address. Some of the subsequent accesses after the first may be a preceding as well as succeeding column addresses depending upon the starting address entered. This sequence can be programmed to follow either a serial burst or an interleave burst pattern. The length of the burst sequence can be user programmed to be either 1, 2, 4 or 8 bit accesses. After a read burst is completed, as determined by the programmed burst length, the data outputs are in a high impedance state until the next read access is initiated.

Concerning latency, the beginning data output cycle of a read burst can be programmed to occur 1, 2, 3 or 4 clock cycles after the read command. This feature allows the user to adjust the memory device 100 to operate in accordance with the systems capability for frequency and latency to latch the data output from the memory device. The delay between the read command and the beginning of the output burst is known as read latency, also known as CAS_ latency. After the initial output cycle has commenced, the data burst occurs at the clock frequency without any intervening gaps.

In FIG. 19, chart 1900 indicates the two-bit burst sequences in both decimal and binary notation for serial and interleaved mode. The sequence is dependent upon the internal value of column address A0.

In FIG. 20, chart 2000 indicates the four-bit burst sequences as they occur in response to internal column addresses A1 and A0 in decimal and binary notation for serial and interleave mode. Thus, in serial mode, with a binary start address of 11, the second binary address to be accessed is 00, the third binary address to be accessed is 01 and the fourth binary address to be accessed is 10. In interleaved mode, if the first binary address to be accessed is 11, the second binary address to be accessed is 10, the third binary address to be accessed is 01 and the fourth binary address to be accessed is 00. Note that the serial and interleaved modes differ in the order of data bits that are accessed from the second, third and fourth positions.

In FIG. 21, chart 2100 indicates the eight-bit burst sequences for internal column addresses A0, A1 and A2 in both binary and decimal for serial and interleaved modes. For example, with a binary start address of 111 in a serial mode, the next binary address will be 000 and then incrementing one binary digit at a time through the eighth bit sequence. This contrasts with the interleaved mode starting with address 111 which counts down in a binary sequence through the eighth bit burst.

The two-bit, four-bit and eight-bit burst sequences depicted in FIGS. 19, 20 and 21 are industry standards. The previously described circuits of memory device 100 achieve operation according to this industry standard with a four-bit prefetch architecture.

Figure 22:
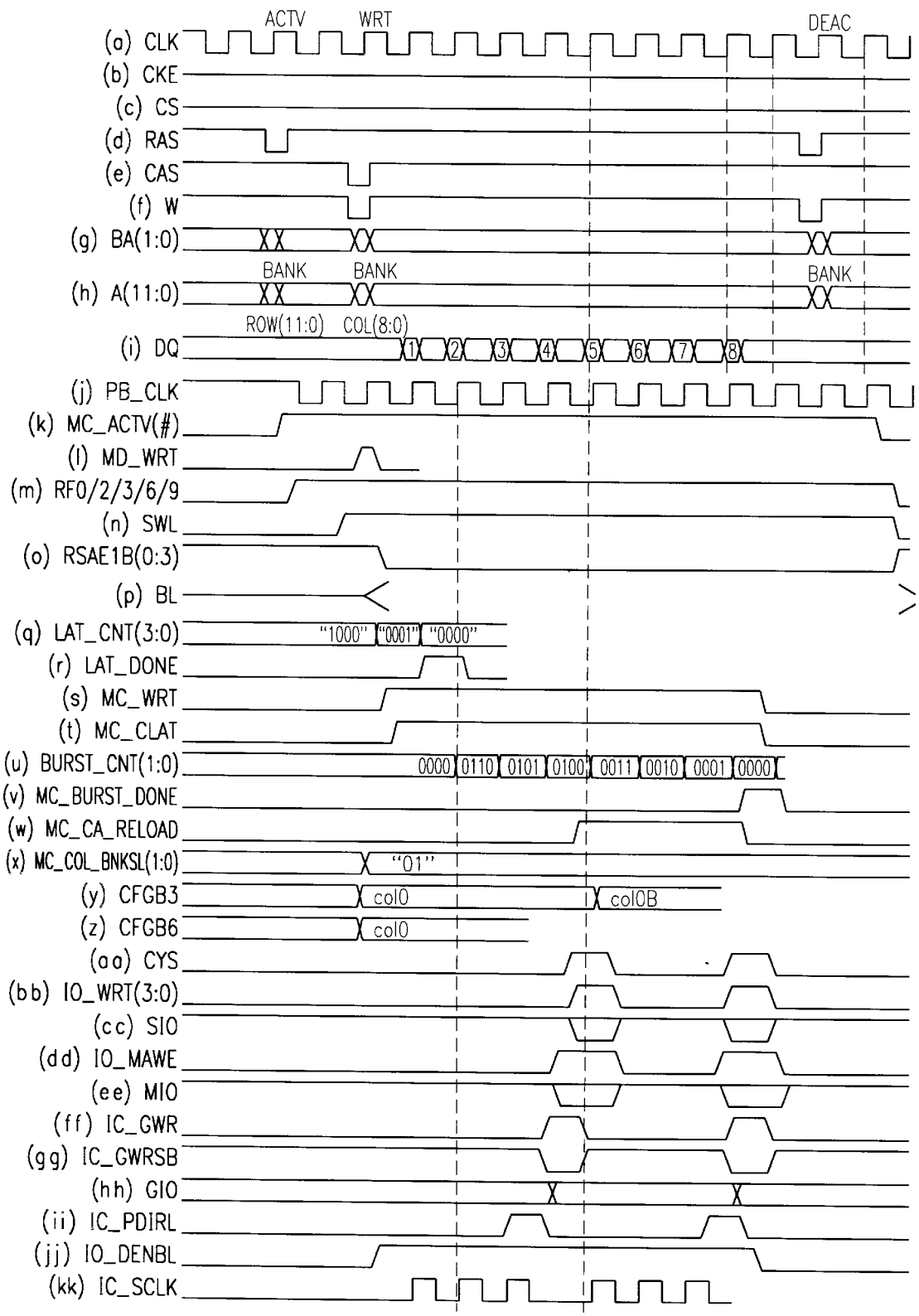
FIGS. 22(a) through (kk) are timing diagrams indicating signals for an 8-bit burst write of data to the chip at 150 Megahertz.

In FIG. 22, the timing of signals applied to and occurring in memory device 100 are depicted for an 8-bit serial burst write. Table 3 identifies the signals of FIG. 22 by figure letter, acronym and common name.

TABLE 3

| (a) | CLK | clock |
| --- | --- | --- |
| (b) | CKE | clock Enable |
| (c) | CS | chip select |
| (d) | RAS | row address strobe |
| (e) | CAS | column address strobe |
| (f) | W | write |
| (g) | BA(1:0) | bank address 1 and 0 |

TABLE 3-continued

| | | |
|---|---|---|
| (h) | A(11:0) | addresses 0–11 |
| (i) | DQ | data I/O |
| (j) | PB_CLK | internal clock |
| (k) | MC_ACTV(0:3) | main control activate |
| (l) | MD_WRIT | mode decode, write |
| (m) | RF0/2/3/6/9 | row factors 0, 2, 3, 6 and 9 |
| (n) | SWL | sub word line |
| (o) | RSAE1B(0:3) | row sense amp enable |
| (p) | BL | bit line |
| (q) | LAT_CNT(3:0) | latency count |
| (r) | LAT_DONE | latency done |
| (s) | MC_WRT | main control write |
| (t) | MC_CLAT | main control column latency |
| (u) | BURST_CNT(1:0) | burst count |
| (v) | MC_BURST_DONE | main control burst done |
| (w) | MC_CA_RELOAD | main control column address reload |
| (x) | MC_COL_BNKSL | main control column bank select |
| (y) | CFGB3 | column factor global bar 3 |
| (z) | CFGB6 | column factor global bar 6 |
| (aa) | CYS | column Y-select |
| (bb) | IO_WRIT | I/O write |
| (cc) | SIO | sub I/O lines |
| (dd) | IO_MAWE | I/O main amp write enable |
| (ee) | MIO | main I/O lines |
| (ff) | IC_GWR | I/O control ganged write |
| (gg) | IC_GWRSB | I/O control ganged write start bar |
| (hh) | GIO | global I/O lines |
| (ii) | IC_PDIRL | I/O control parallel data in register latch |
| (jj) | IC_DENBL | I/O control data input buffer enable |
| (kk) | IC_SCLK | I/O control shift clock |

In FIG. 22, the signals in waveforms 22(*a*) through 22(*i*) are applied to chip 300 in time reference with clock signal CLK and RAS, CAS and W. Internally, the chip 300 produces the signals represented by waveforms 22(*j*) through 22(*z*) in preparation for writing data to the addressed memory cells. The signals in waveforms 22(*aa*) through 22(*kk*) then occur in chip 300 to load the data signals in the addressed memory cells.

In FIG. 22(*kk*), the signal IC_SCLK occurs in two groups of three cycles with one group occurring for each four bit pre-fetch cycle. The beginning of each of these three clock cycles occurs in conjunction with the first bits of data, FIG. 22(*kk*), being written into the memory device in each pre-fetch cycle. The fourth data bit of each pre-fetch cycle needs no additional clock signal because that fourth bit directly flows through the data circuitry to the data lines. This is during a write cycle.

Figure 23:
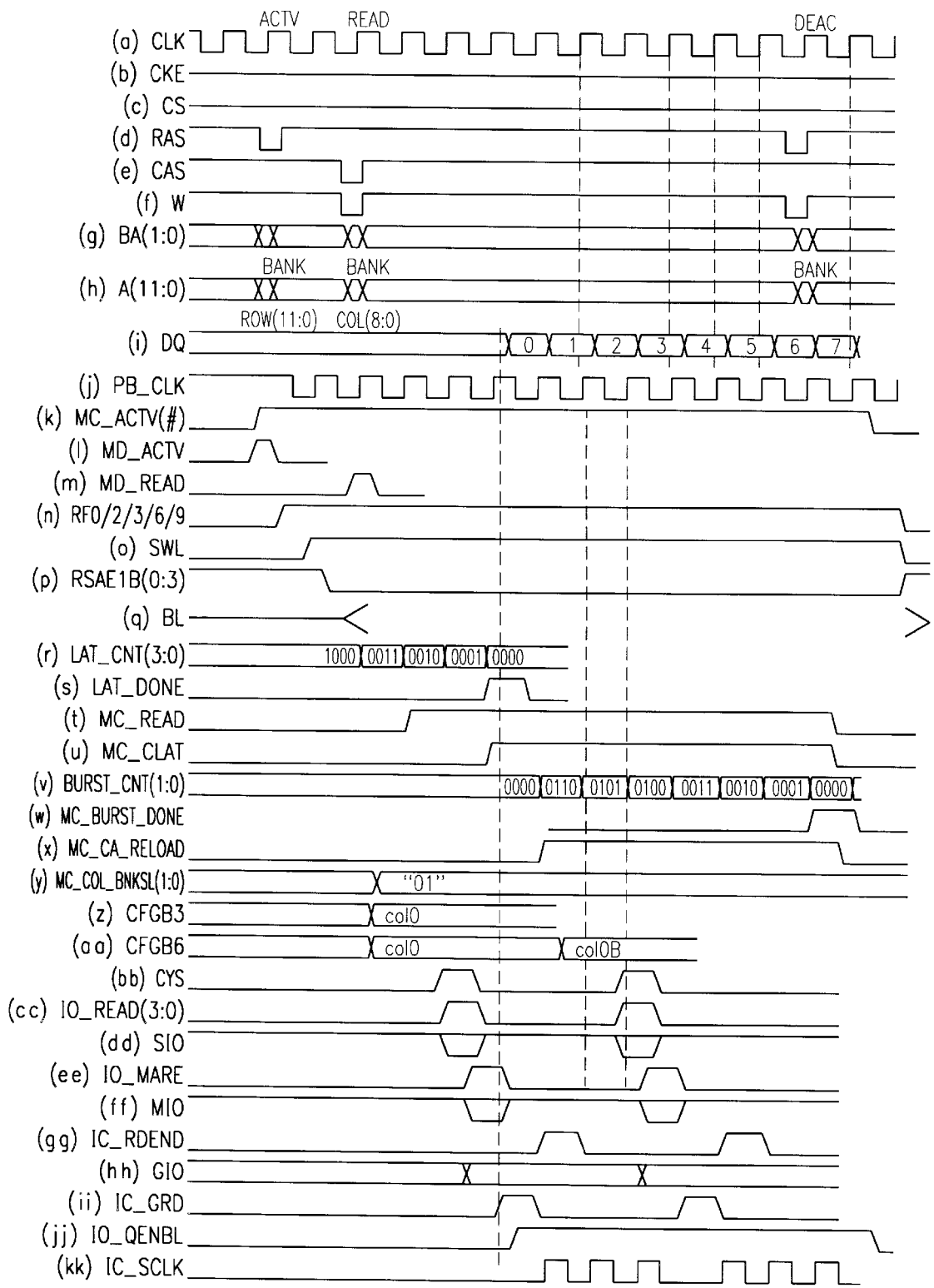
FIGS. 23(a) through (kk) are timing diagrams indicating signals for an 8-bit burst read of data from the chip at 150 Megahertz.

In FIG. 23, the timing of signals applied to and occurring in memory device 100 are depicted for an 8-bit burst read with a CAS or read latency equal to four. Table 4 identifies the signals of FIG. 23 by figure letter, acronym and common name.

TABLE 4

| | | |
|---|---|---|
| (a) | CLK | clock |
| (b) | CKE | clock Enable |
| (c) | CS | chip select |
| (d) | RAS | row address strobe |
| (e) | CAS | column address strobe |
| (f) | W | write |
| (g) | BA(1:0) | bank addresses |
| (h) | A(11:0) | addresses 0–11 |
| (i) | DQ | data I/O |
| (j) | PB_CLK | internal clock |
| (k) | MC_ACTV(0:3) | main control activate |
| (l) | MD_ACTV | mode decode activate |
| (m) | MD_READ | mode decode read |
| (n) | RF0/2/3/6/9 | row factors |
| (o) | SWL | sub word line |
| (p) | RSAE1B(0:3) | row sense amp enable |
| (q) | BL | bit line |
| (r) | LAT_CNT(3:0) | latency control |
| (s) | LAT_DONE | latency done |
| (t) | MC_READ | main control read |
| (u) | MC_CLAT | main control latency |
| (v) | BURST_CNT | burst count |
| (w) | MC_BURST_DONE | main control burst done |
| (x) | MC_CA_RELOAD | main control column address reload |
| (y) | MC_COL_BNKSL | main control column bank select |
| (z) | CFGB3 | column factor global bar 3 |
| (aa) | CFGB6 | column factor global bar 6 |
| (bb) | CYS | column Y select |
| (cc) | IO_READ | I/O read |
| (dd) | SIO | sub I/O lines |
| (ee) | IO_MARE | I/O main amp read enable |
| (ff) | MIO | main I/O lines |
| (gg) | IC_RDEND | I/O control read end |
| (hh) | GIO | global I/O lines |
| (ii) | IC_GRD | I/O control ganged read |
| (jj) | IC_QENBL | I/O control data enable |
| (kk) | IC_SCLK | I/O control serial clock |

In FIG. 23, the signals in waveforms 23(*a*) through 23(*h*) are applied to chip 300 in time with clock signal CLK and RAS, CAS and W. Internally, the chip 300 produces the signals represented by waveforms 23(*j*) through 23(*z*) in preparation for reading data from the addressed memory cells. The signals in waveforms 23(*i*) and 23(*aa*) through 22(*kk*) then occur in chip 300 to read the data signals from the addressed memory cells.

In FIG. 23 (*kk*), the signal IC_SCLK occurs in two groups of three cycles with one group occurring for each four bit pre-fetch cycle. The beginning of each of these three clock cycles occurs in conjunction with the second bit of data, FIG. 23(*i*), being read from the memory device in each pre-fetch cycle. The first data bit of each pre-fetch cycle needs no additional clock signal because that first bit directly flows out of the data circuitry from the data lines. This is during a read cycle.

The memory device 100 contains four independent banks that can be accessed individually or in an interleaved manner. Each bank must be activated with a row address before it can be accessed. Each bank must then be deactivated before it can be activated again with a new row address. The bank activate/row address entry command (ACTV) is entered by holding RAS_ low, CAS_ high, W_ high, A0–A11, BA0, and BA1 valid on the rising edge of clock CLK. A bank can be deactivated either automatically after a READ or a WRITE burst is completed or by use of the deactivate command (DEAC) command. All banks can be deactivated at once by use of the command DCAB.

Four independent banks allow the user to access information on random rows at a higher rate of operation than is possible with a standard DRAM. This can be accomplished by activating one bank with a row address and while the data stream is received from or written to that bank, activating a second, third or fourth bank with another row address. When the data stream to or from the first bank is complete, the data stream to or from a second bank can commence without interruption. After the second bank is activated, the first bank can be deactivated to allow the entry of a new row address for the next round of accesses. When the data stream to or from the second bank is complete, the data stream to or from the third bank can commence without interruption. In this manner, operation can continue in an interleaved fashion.

The availability of four banks allows the access of data from random starting columns along banks at a higher rate of operation. After activating multiple banks with a row address, BA0, BA1 can be used to alternate read or write commands among the banks to provide gapless accesses at the clock frequency provided all specified timing requirements are met.

With a four-bit prefetch architecture 4 bits of data are accessed at one time. An eight-bit burst requires two fetches from the selected bank, first to obtain the initial four-bits and then to obtain the second four-bits of data.

The memory device 100 can be arranged and constructed differently from as disclosed in the preceding discussion. Other specific circuits may be used while remaining within the scope of the following claims.

We claim:

1. A memory device comprising:
   a. a semiconductor substrate carrying plural bond pads, the bond pads extending along the substrate in a first direction, the bond pads carrying data signals to and from the device, the data signals being arranged in words of plural bits, each bond pad carrying one data bit of each word and the bond pads being arranged in a certain order;
   b. arrays of memory cells formed on and extending across the substrate, the arrays of memory cells storing the data signals carried to and from the device by the bond pads, the arrays of memory cells being arranged in banks that extend in the first direction in parallel with the bond pads, in each bank the arrays of memory cells being arranged in columns arranged transverse to the first direction and the columns being paired with one another; and
   c. data circuits transmitting the data signals between the bond pads and arrays, the data circuits including data lines extending between the bond pads and pairs of columns of arrays, each data line extending from one bond pad to plural pairs of columns of arrays in a sequence the same as the certain order.

2. The memory device of claim 1 in which the bond pads are arranged in a line along the central axis of the substrate.

3. The memory device of claim 1 in which each data line extends from one bond pad to four pairs of columns of arrays.

4. The memory device of claim 1 in which plural data lines extend to each pair of columns of arrays in a particular arrangement the same as the certain order.

5. The memory device of claim 4 in which four data lines extend to each pair of columns of arrays in the particular arrangement.

* * * * *